(12) United States Patent
Watanabe et al.

(10) Patent No.: US 10,481,354 B2
(45) Date of Patent: Nov. 19, 2019

(54) STRUCTURE OF CONNECTION BETWEEN OPTICAL UNIT AND OPTICAL PATH TUBE

(71) Applicant: Gigaphoton Inc., Tochigi (JP)

(72) Inventors: Yukio Watanabe, Oyama (JP); Hiroshi Someya, Oyama (JP); Yuki Kawashima, Oyama (JP); Yuto Tanaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/055,243

(22) Filed: Aug. 6, 2018

(65) Prior Publication Data

US 2018/0341077 A1 Nov. 29, 2018

Related U.S. Application Data

(63) Continuation of application No. PCT/JP2016/057644, filed on Mar. 10, 2016.

(51) Int. Cl.
*G02B 6/42* (2006.01)
*H05G 2/00* (2006.01)
*G03F 7/20* (2006.01)

(52) U.S. Cl.
CPC ....... *G02B 6/4296* (2013.01); *G03F 7/70033* (2013.01); *G03F 7/70991* (2013.01); *H05G 2/008* (2013.01)

(58) Field of Classification Search
CPC ............... G02B 6/4296; G03F 7/70033; G03F 7/70991; H05G 2/008
See application file for complete search history.

(56) References Cited

U.S. PATENT DOCUMENTS

| 6,275,634 | B1 * | 8/2001 | Potucek | G02B 6/4461 |
| | | | | 385/115 |
| RE38,011 | E * | 3/2003 | Cheng | G02B 6/3869 |
| | | | | 385/76 |
| 2013/0105713 | A1 | 5/2013 | Watanabe et al. | |

(Continued)

FOREIGN PATENT DOCUMENTS

JP S60-088169 U 6/1985
JP S62-016754 A 1/1987

(Continued)

OTHER PUBLICATIONS

International Search Report issued in PCT/JP2016/057644; dated Jun. 7, 2016.

(Continued)

*Primary Examiner* — Daniel Petkovsek
(74) *Attorney, Agent, or Firm* — Studebaker & Brackett PC

(57) ABSTRACT

An optical unit and an optical path tube are easily connected. A structure of connection between a side surface (1a) of the optical unit and the optical path tube includes: an extensible tube (72) constituting at least a part of the optical path tube, the extensible tube being extensible in a tube axis direction; a flange (26) attached to one end of the optical path tube; a flange receiving part (20) provided on the optical unit, the flange receiving part (20) receiving a front surface (26a) of the flange (26), the front surface (26a) of the flange (26) being an end surface on an open side; and a biasing part (23, 72) configured to bias at least a part of the optical path tube in a direction in which the extensible tube (72) extends.

20 Claims, 26 Drawing Sheets

(56) References Cited

U.S. PATENT DOCUMENTS

| | | | | |
|---|---|---|---|---|
| 2014/0216576 A1* | 8/2014 | Someya | ............... | H05G 2/008 |
| | | | | 137/560 |
| 2014/0332700 A1 | 11/2014 | Igarashi et al. | | |
| 2016/0202441 A1* | 7/2016 | Claessens | ............ | G02B 6/3897 |
| | | | | 385/113 |

FOREIGN PATENT DOCUMENTS

| | | |
|---|---|---|
| JP | H06-036014 U | 5/1994 |
| JP | 2003-133622 A | 5/2003 |
| JP | 2003-245790 A | 9/2003 |
| JP | 2005-241414 A | 9/2005 |
| JP | 2007-019083 A | 1/2007 |
| JP | 2011-232247 A | 11/2011 |
| JP | 2013-069655 A | 4/2013 |
| JP | 2013-175431 A | 9/2013 |

OTHER PUBLICATIONS

International Preliminary Report on Patentability issued in PCT/JP2016/057644; dated Sep. 11, 2018.

\* cited by examiner

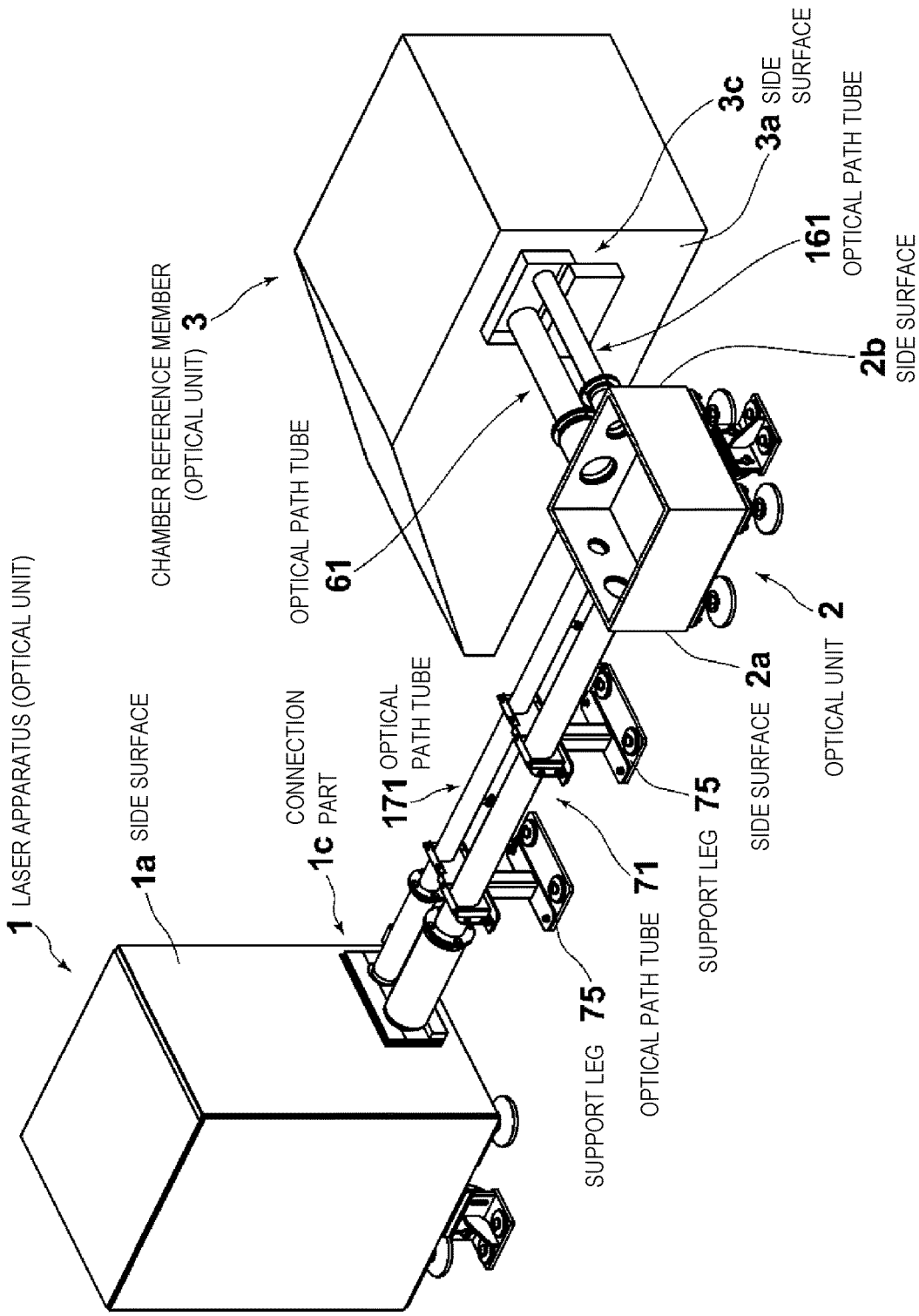
[FIG. 1]

[FIG. 2]
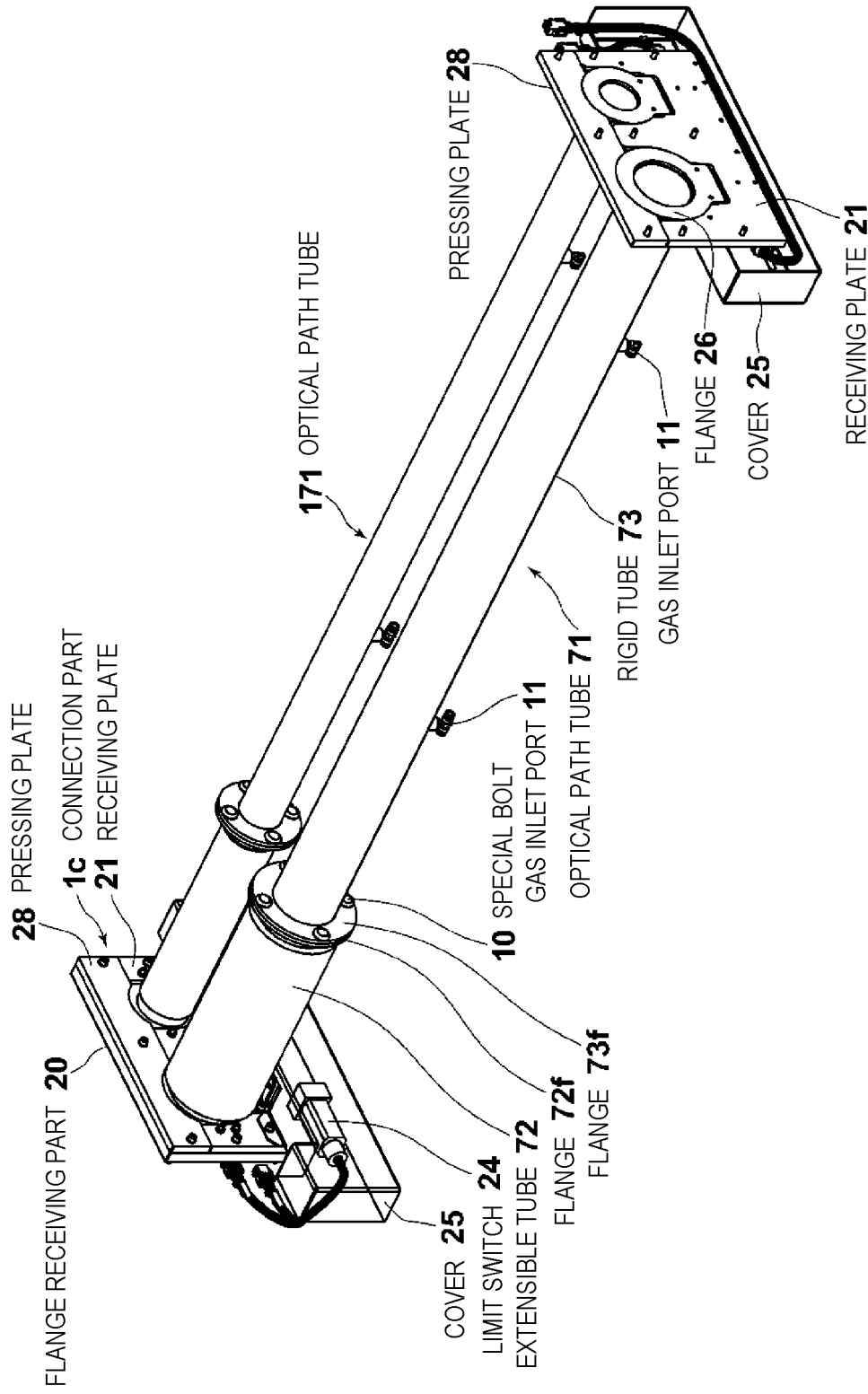

[FIG. 3]
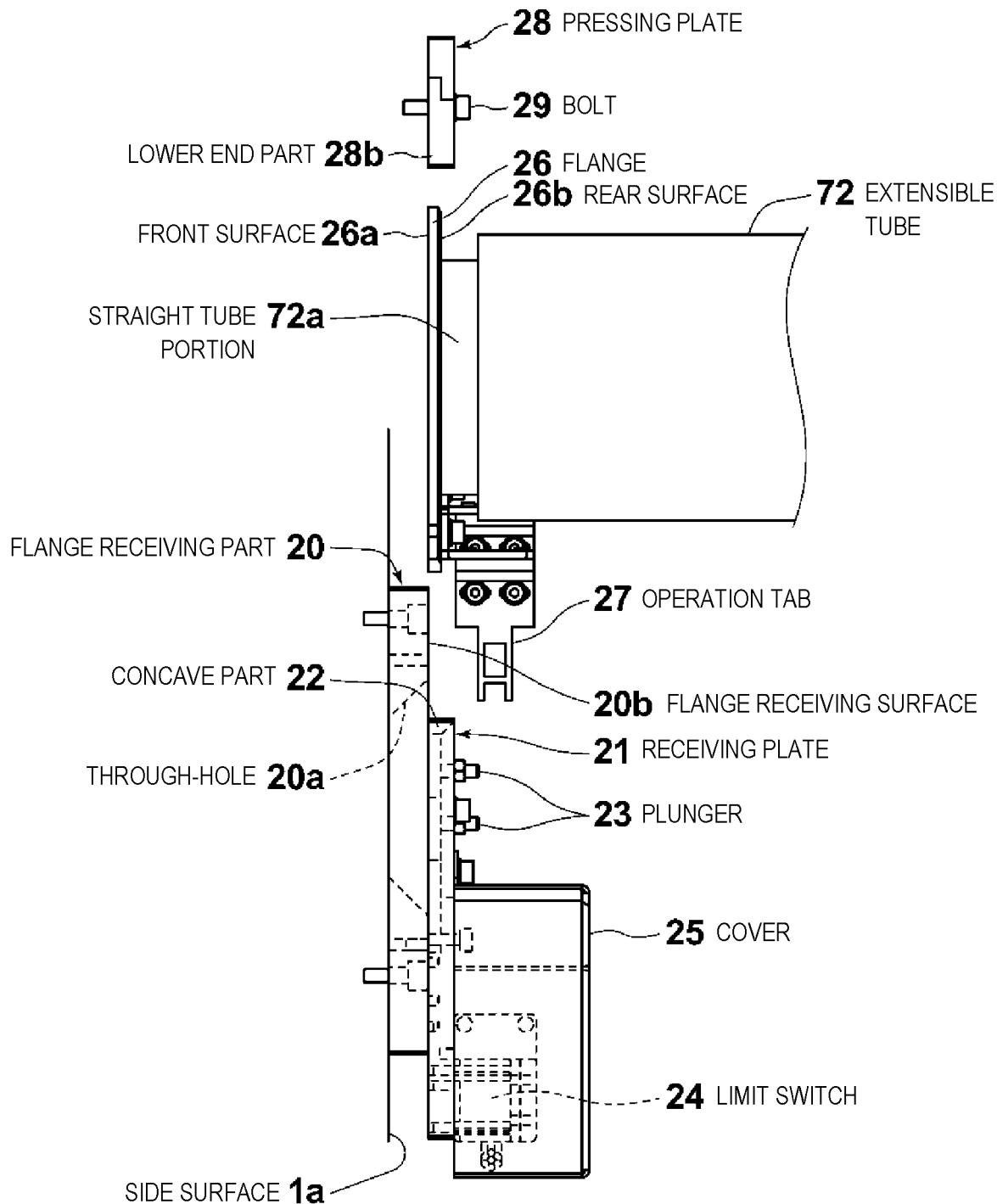

[FIG. 4]
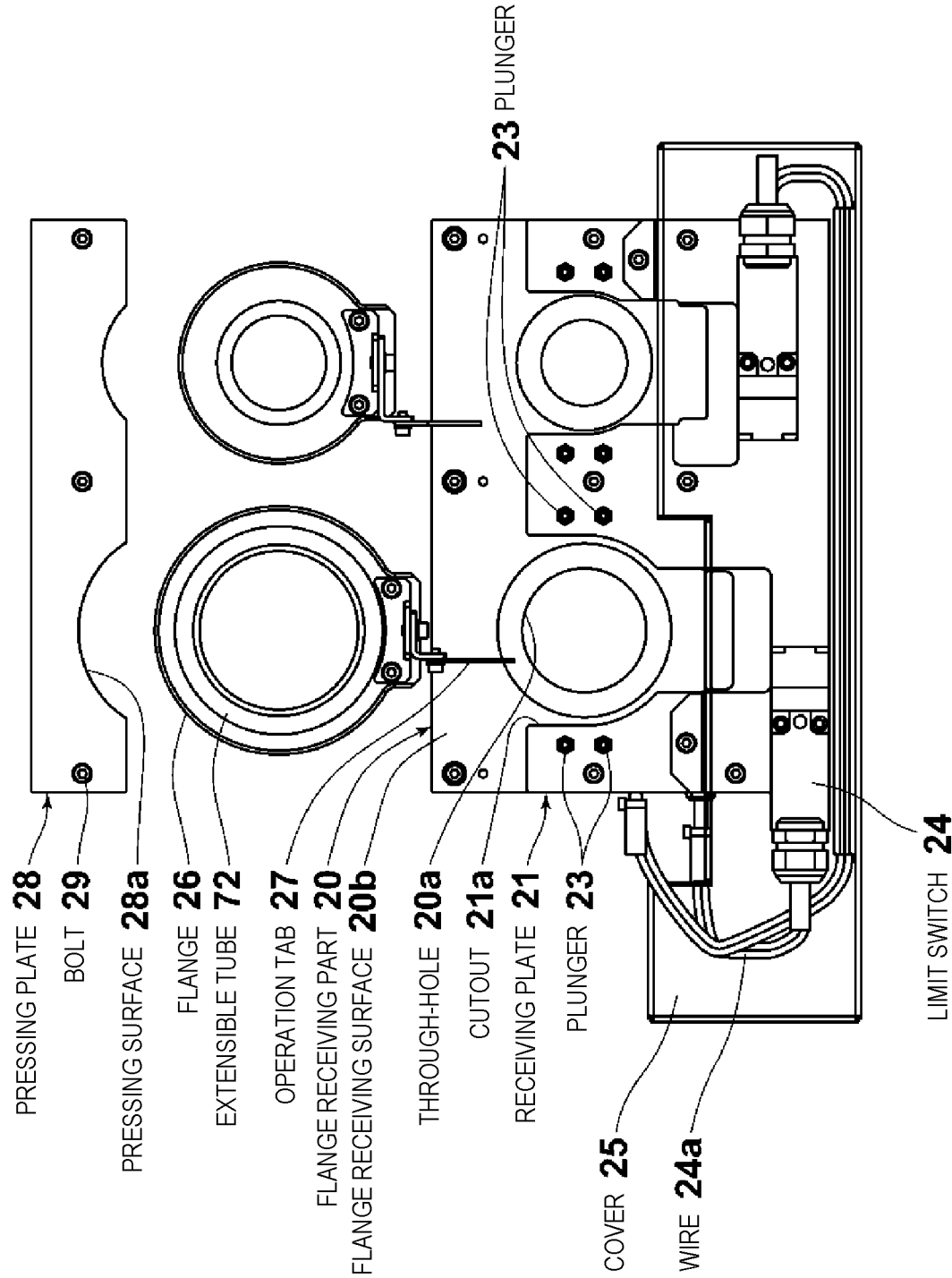

[FIG. 5]
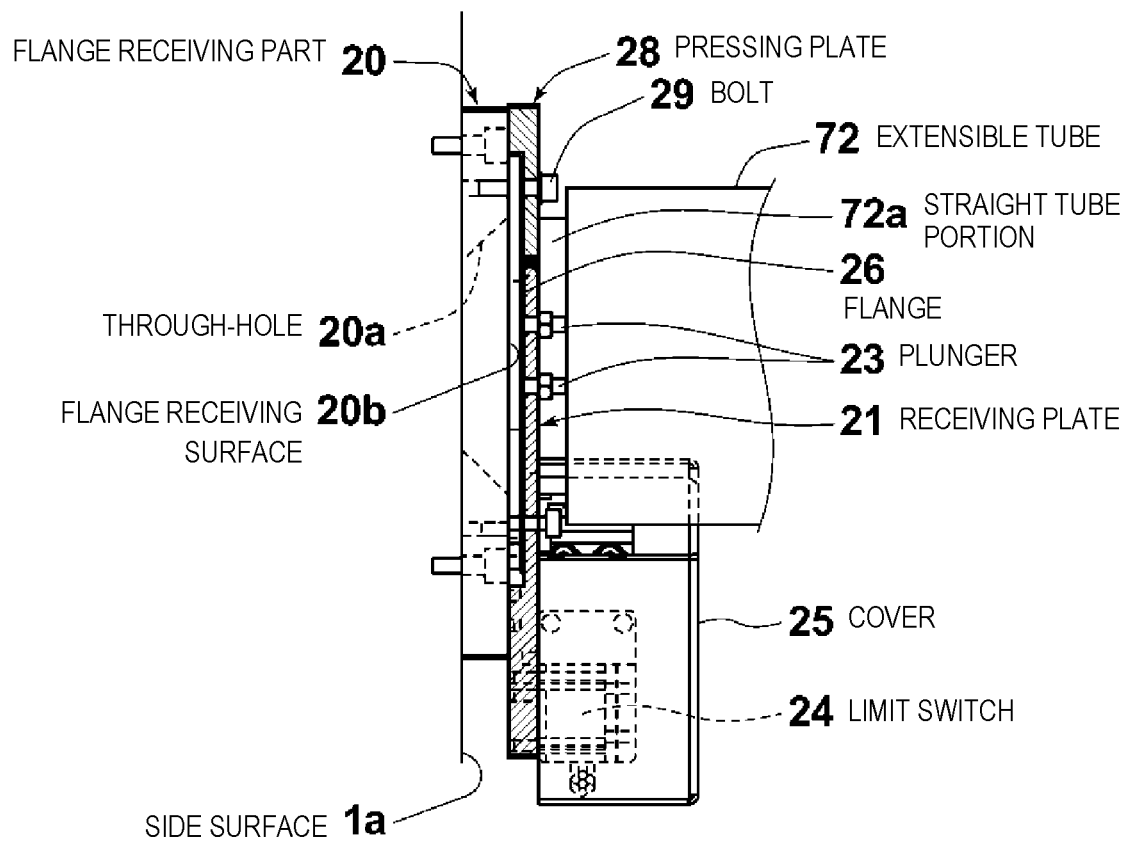

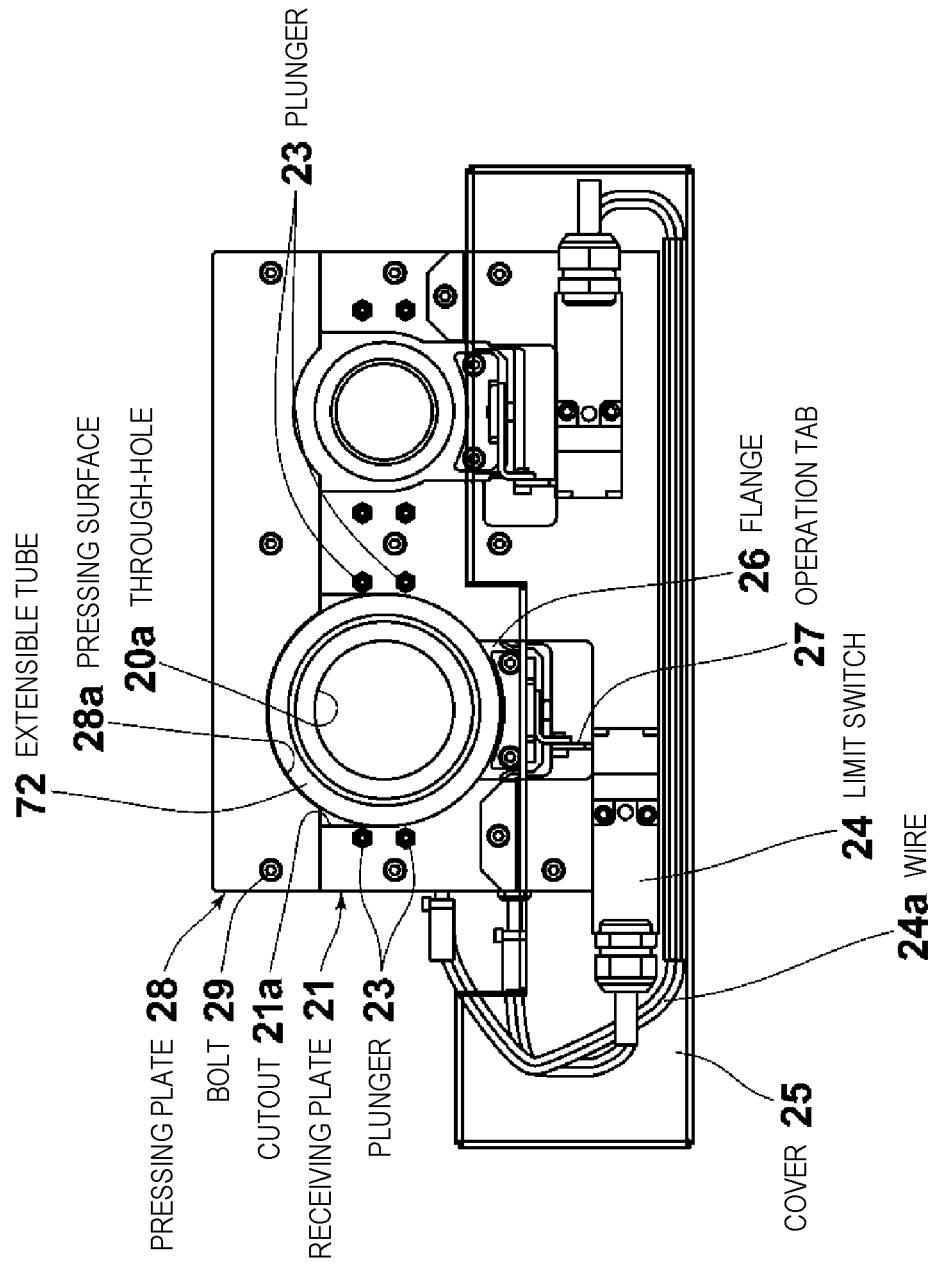
[FIG. 6]

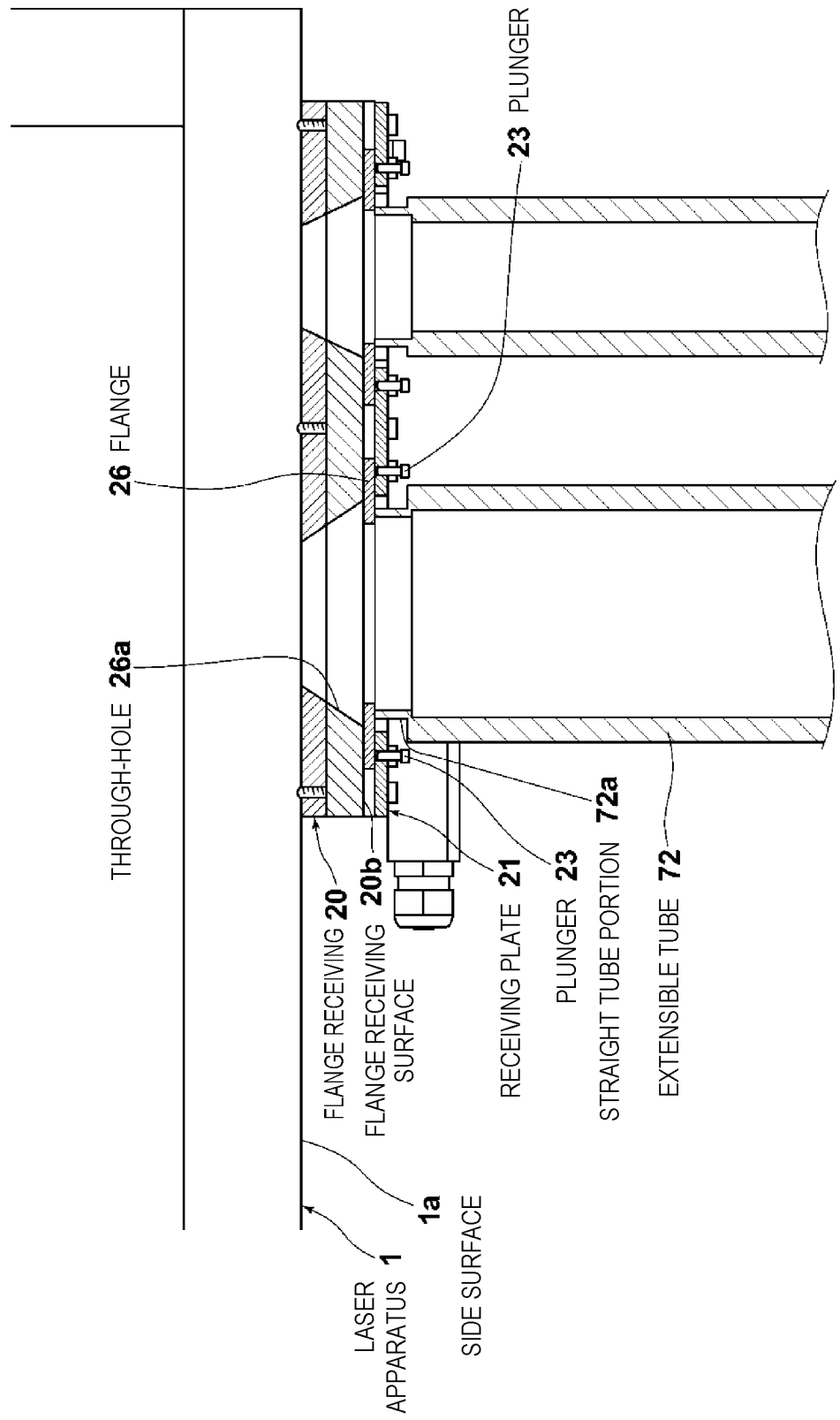
[FIG. 7]

[FIG. 8]
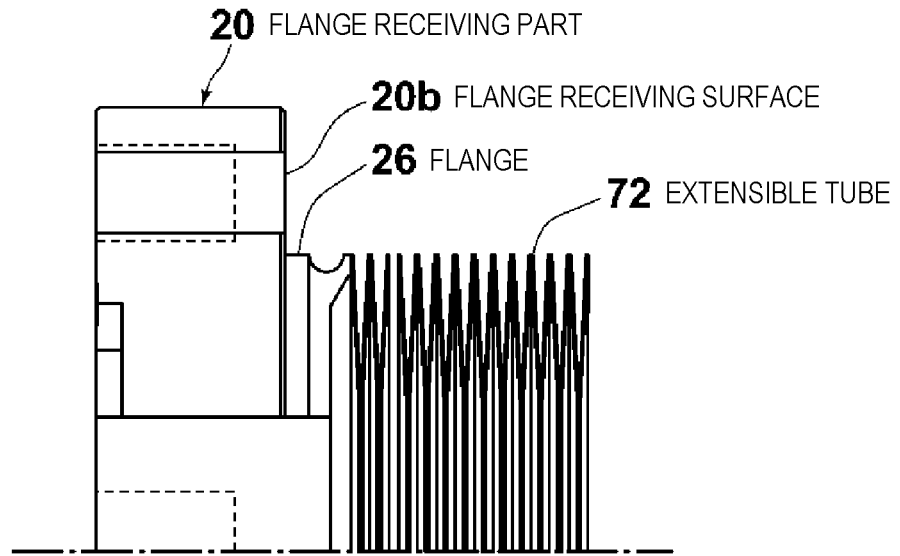
[FIG. 9]
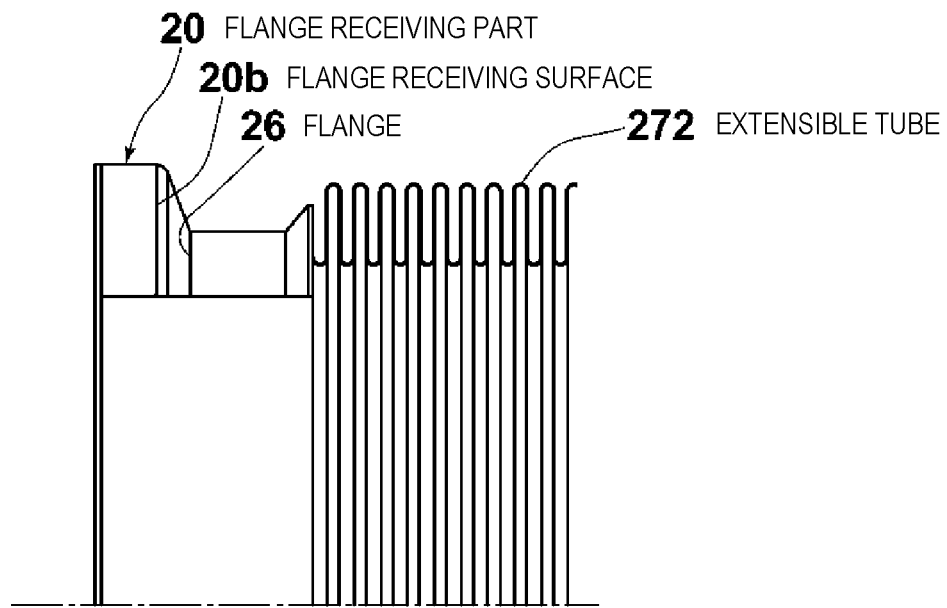

[FIG. 10]
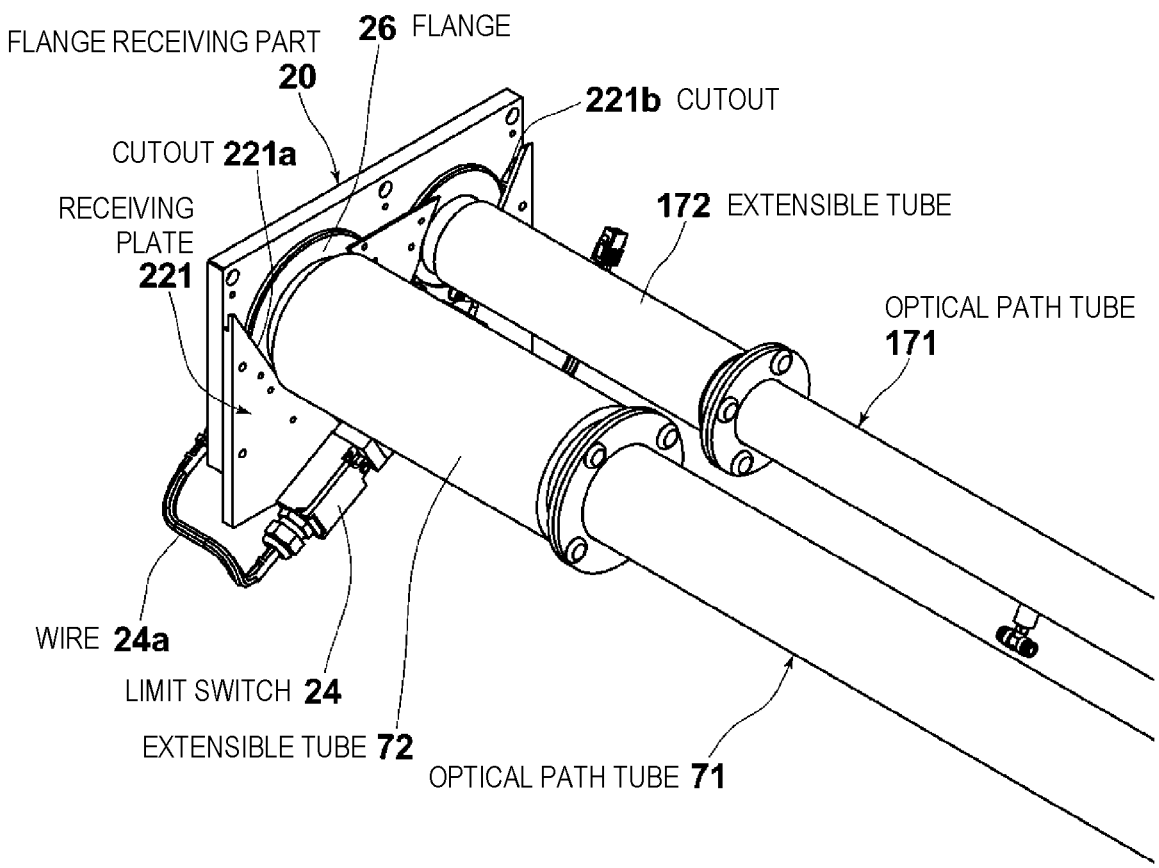

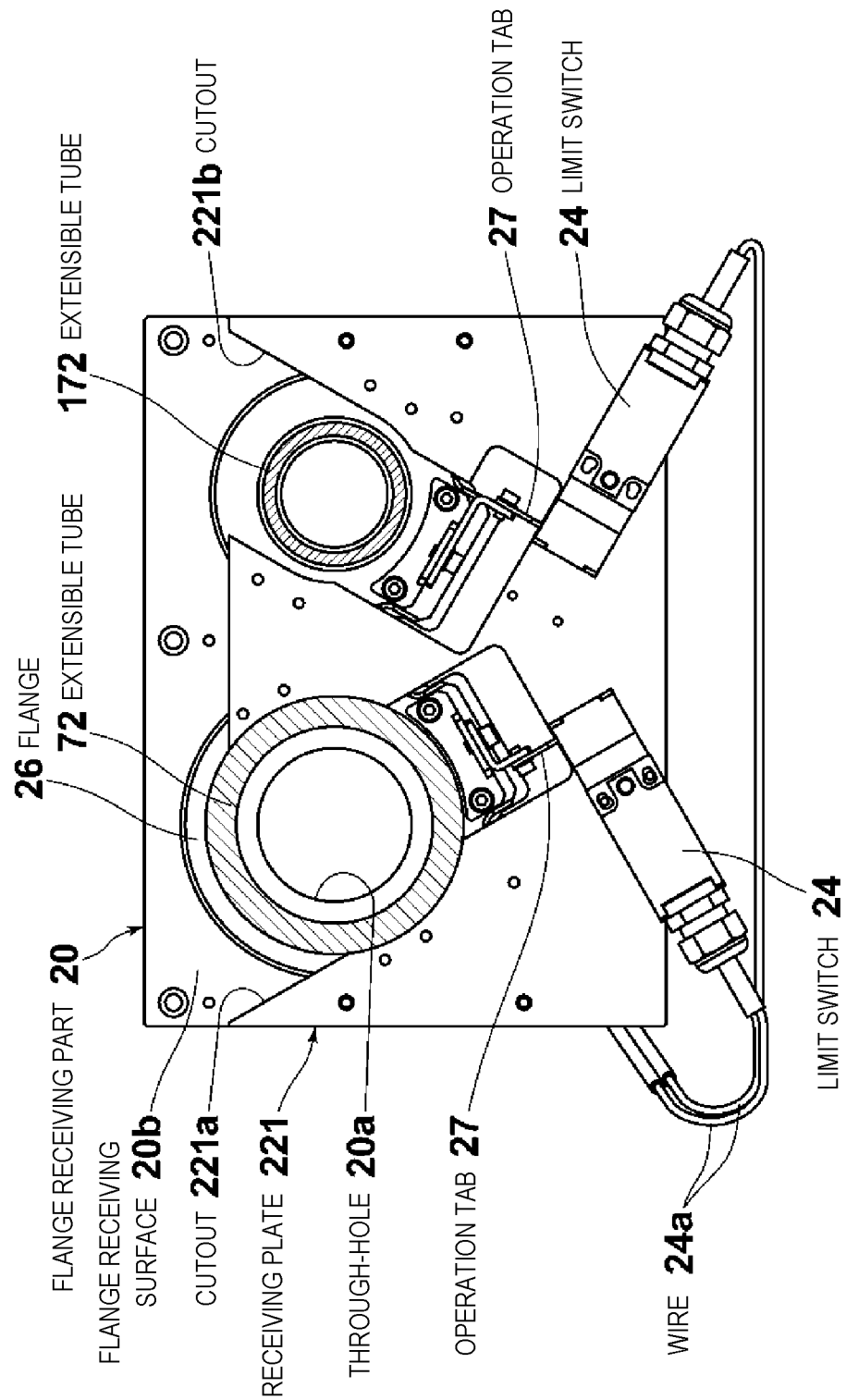
[FIG. 11]

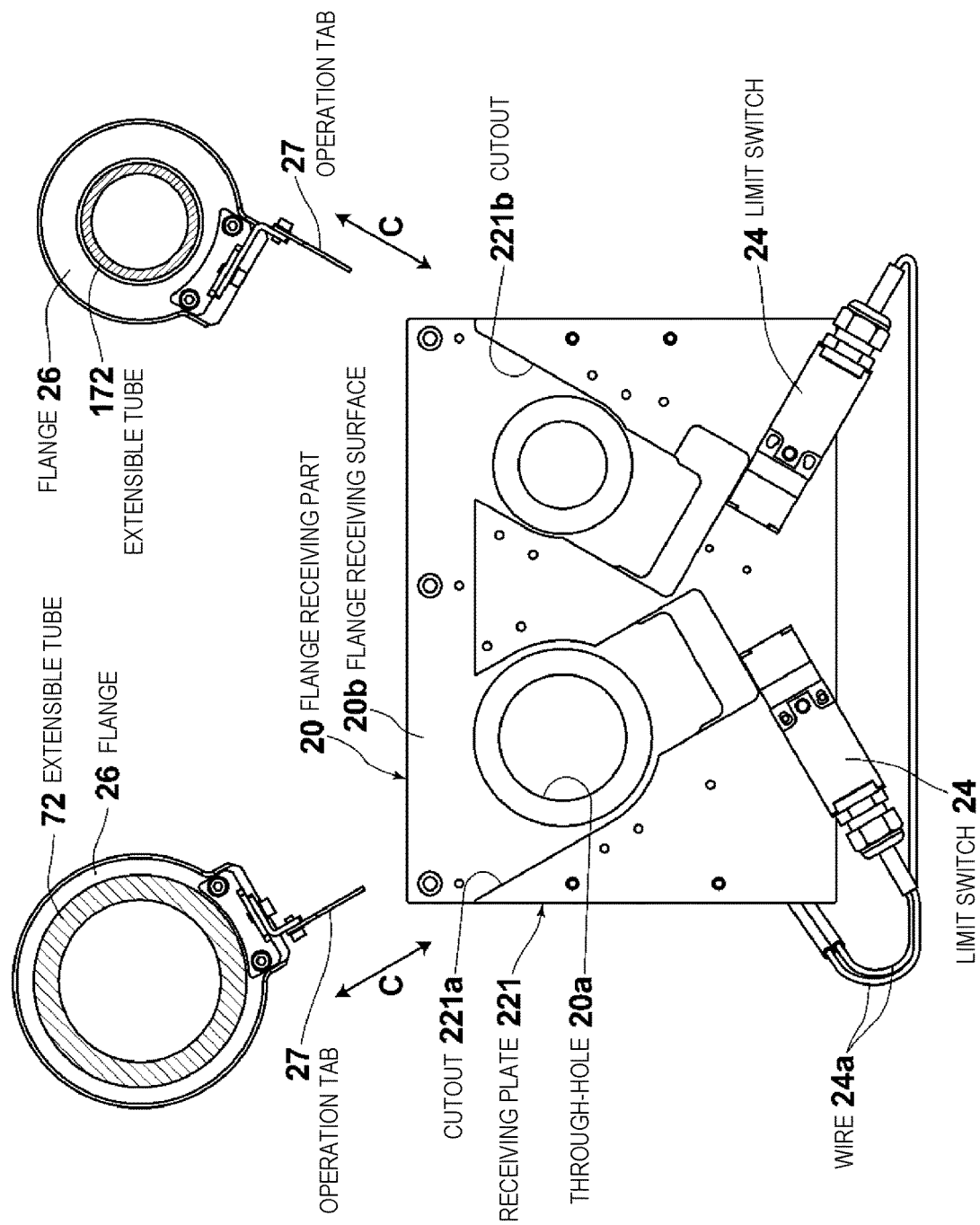
[FIG. 12]

[FIG. 13]
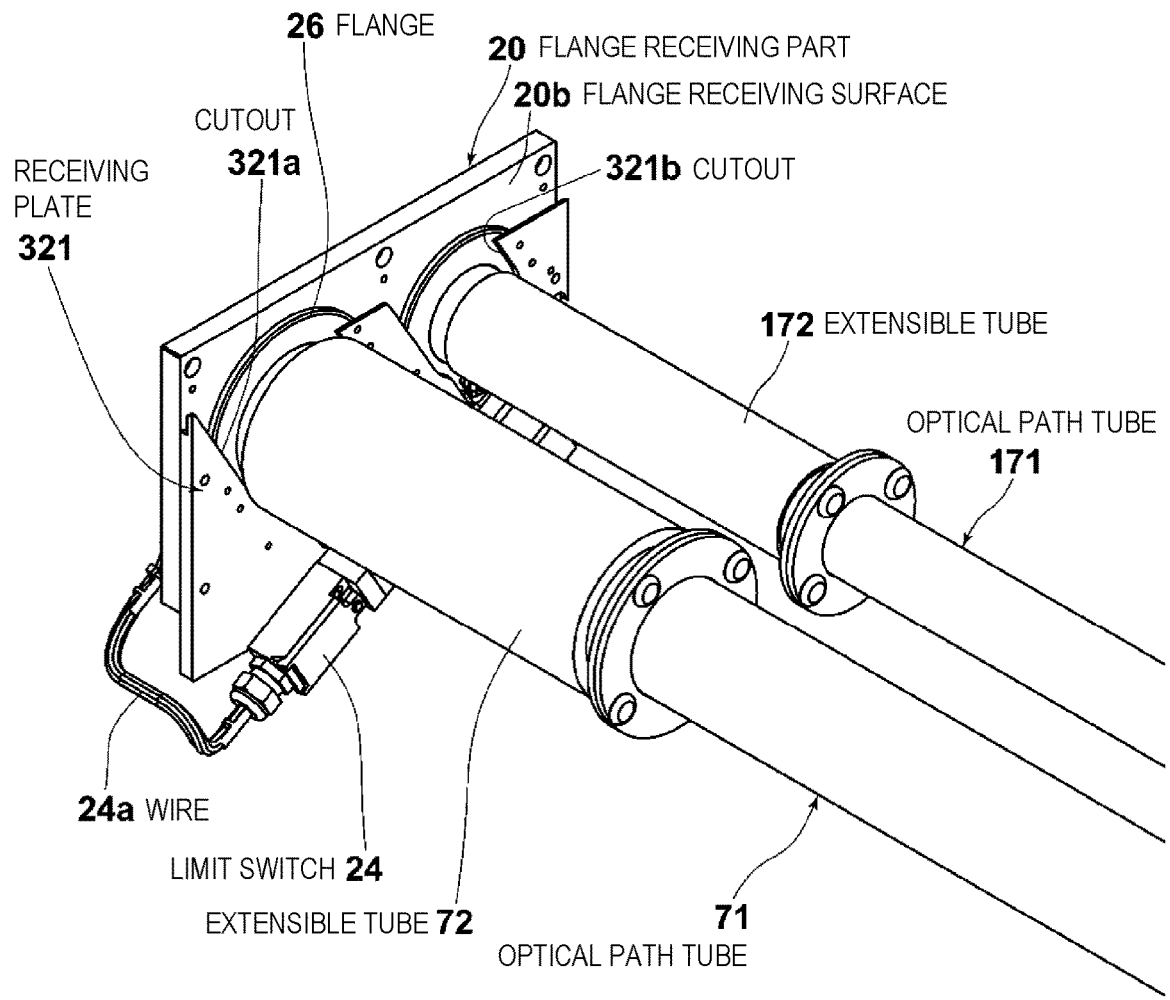

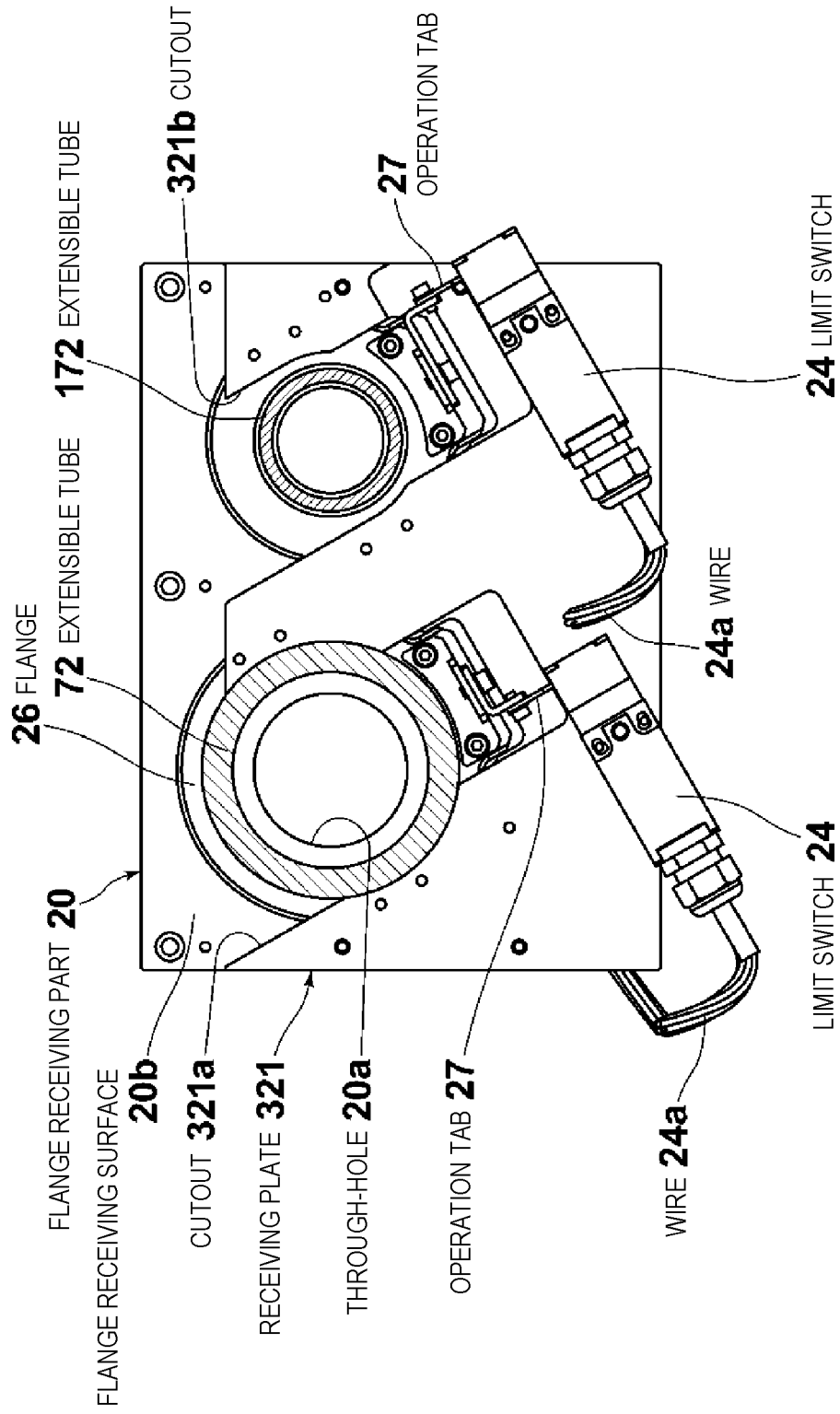
[FIG. 14]

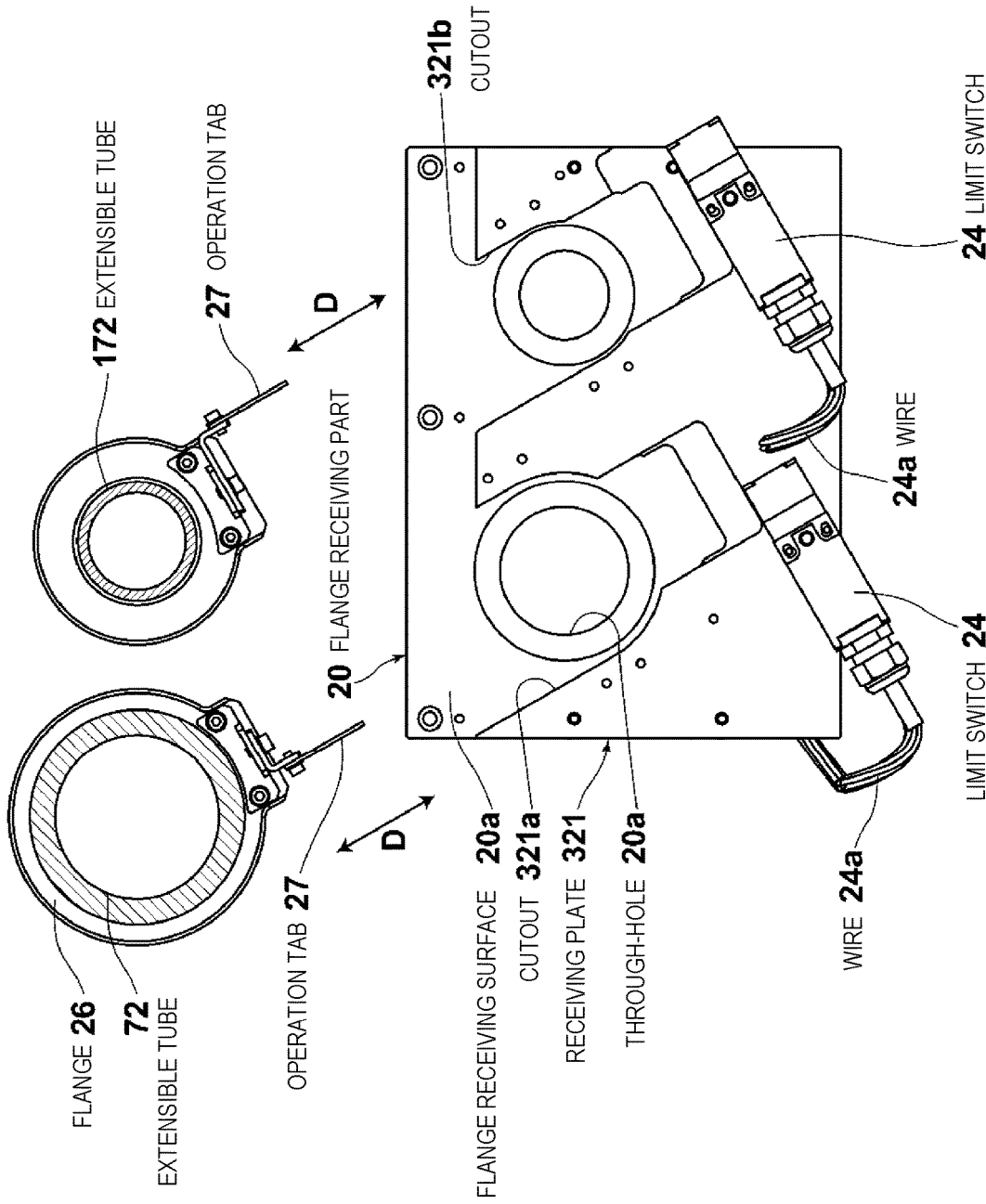
[FIG. 15]

[FIG. 16]
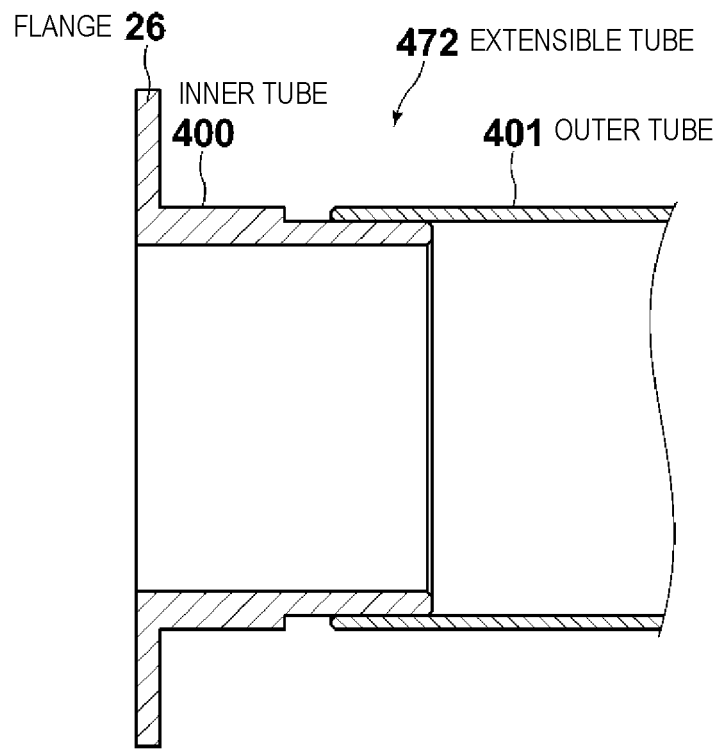
[FIG. 17]
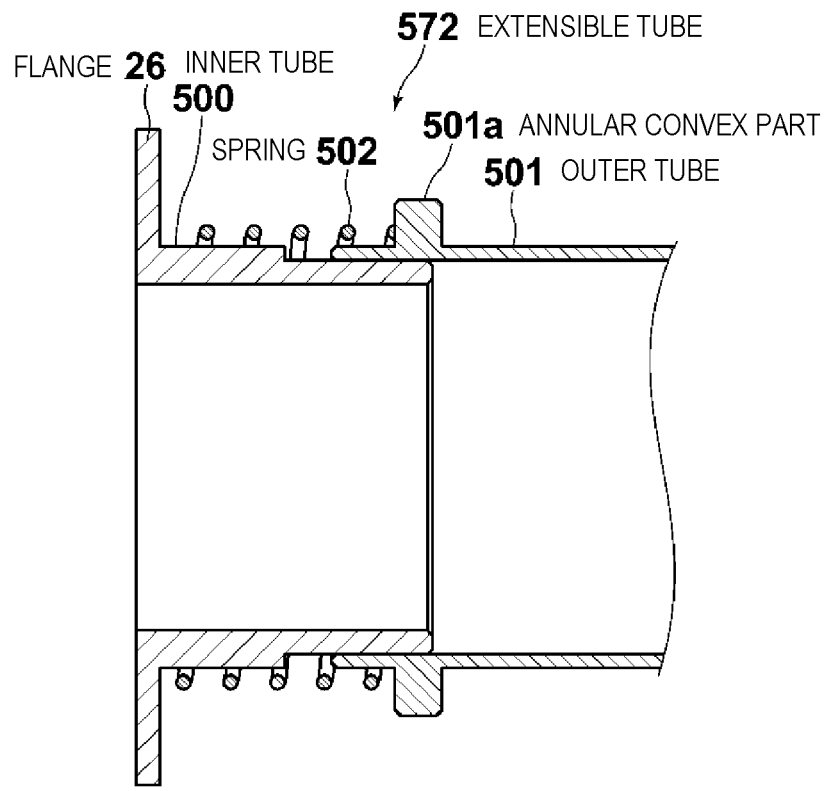

[FIG. 18]
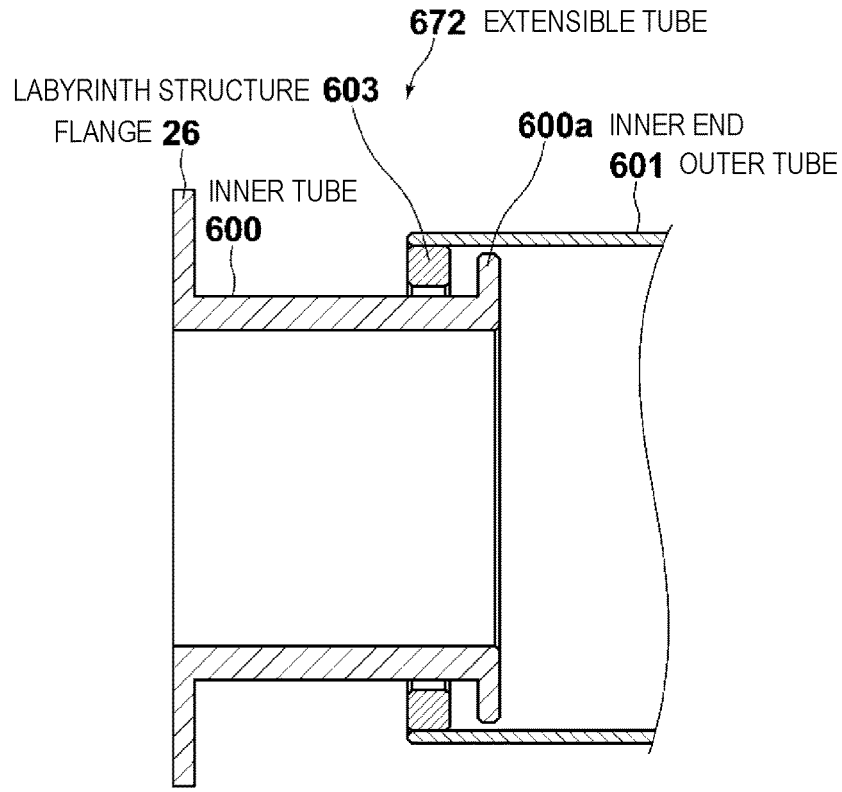
[FIG. 19]
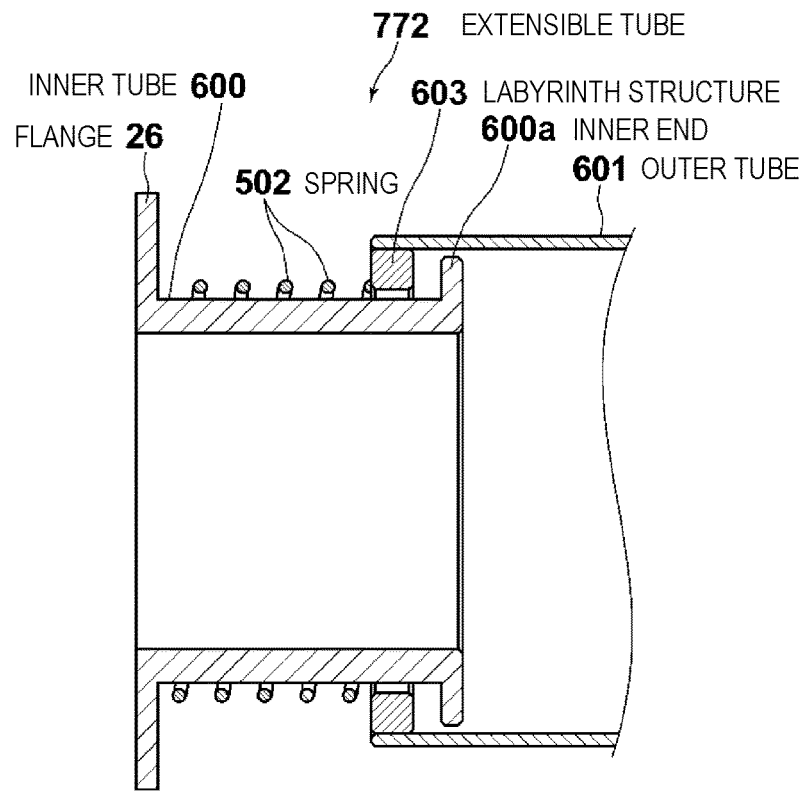

[FIG. 20]
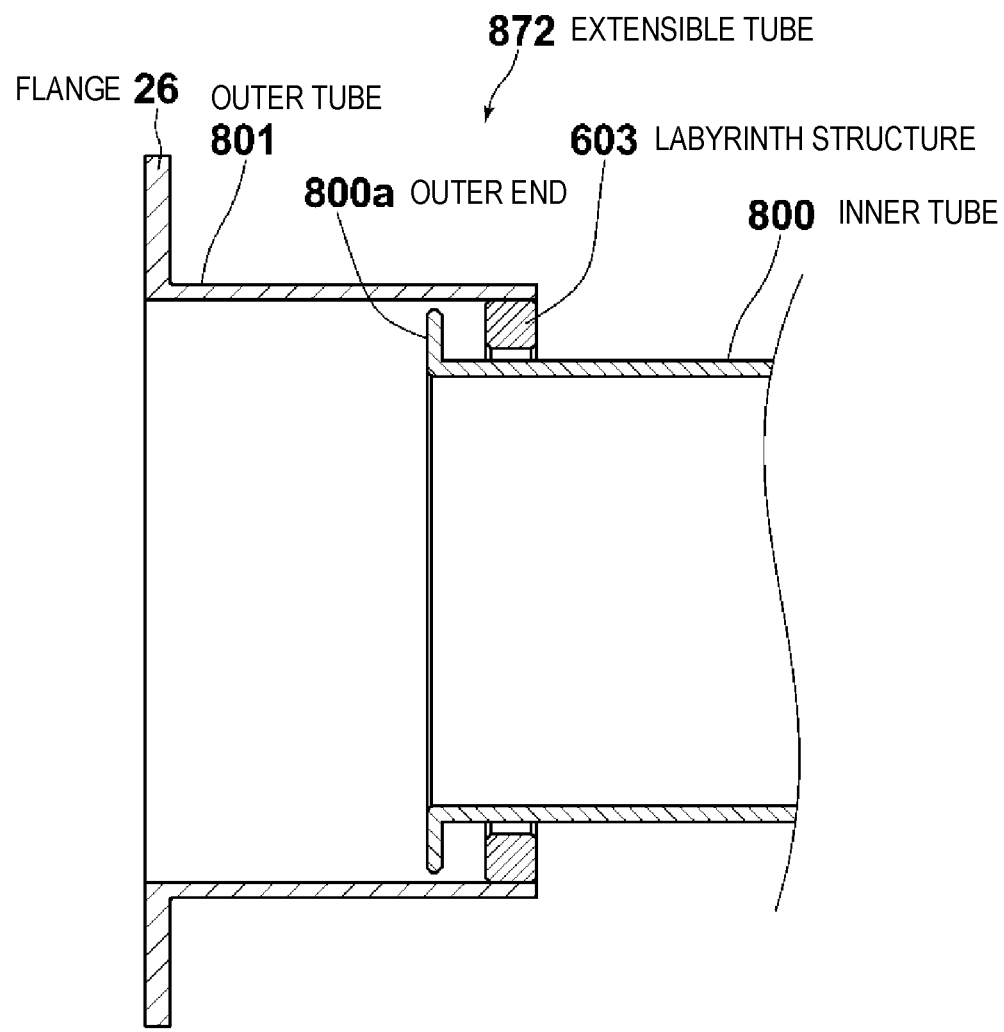

[FIG. 21]
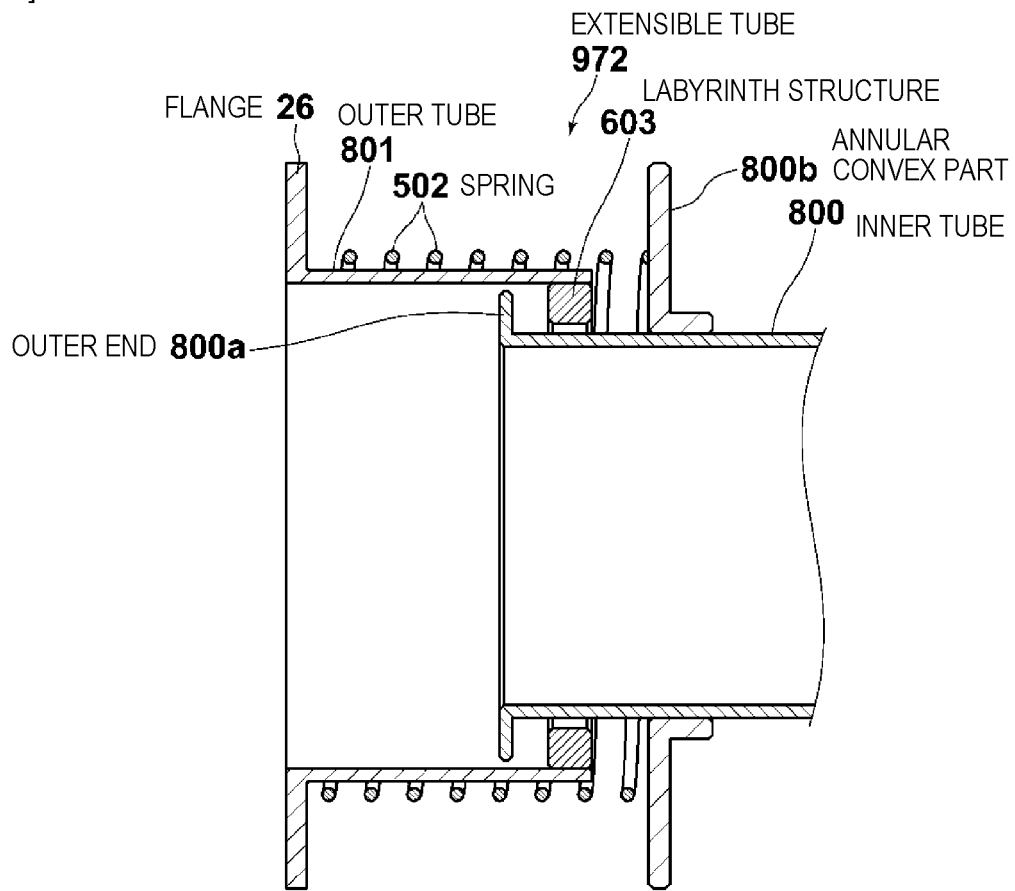
[FIG. 22]
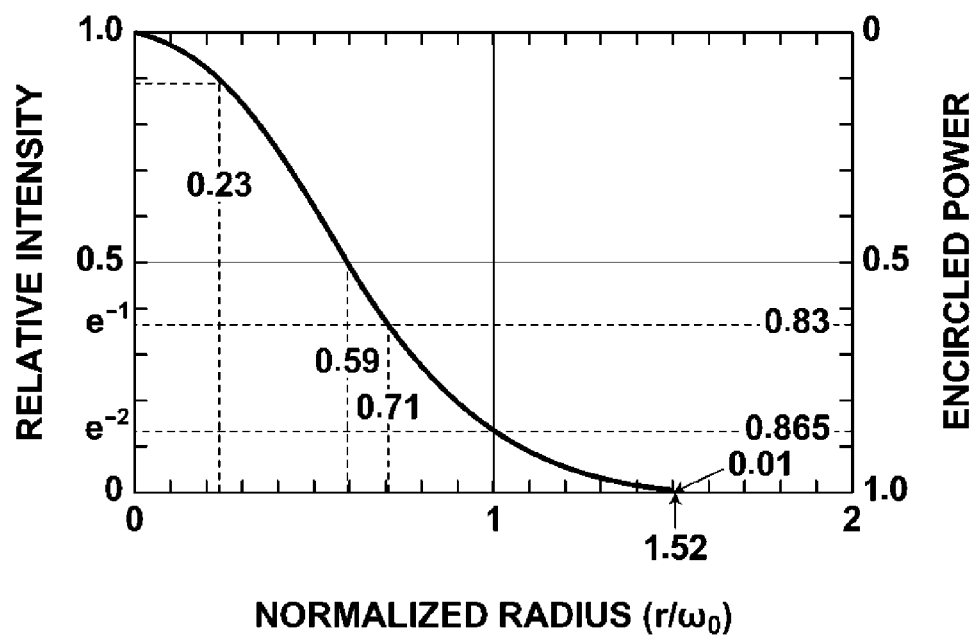

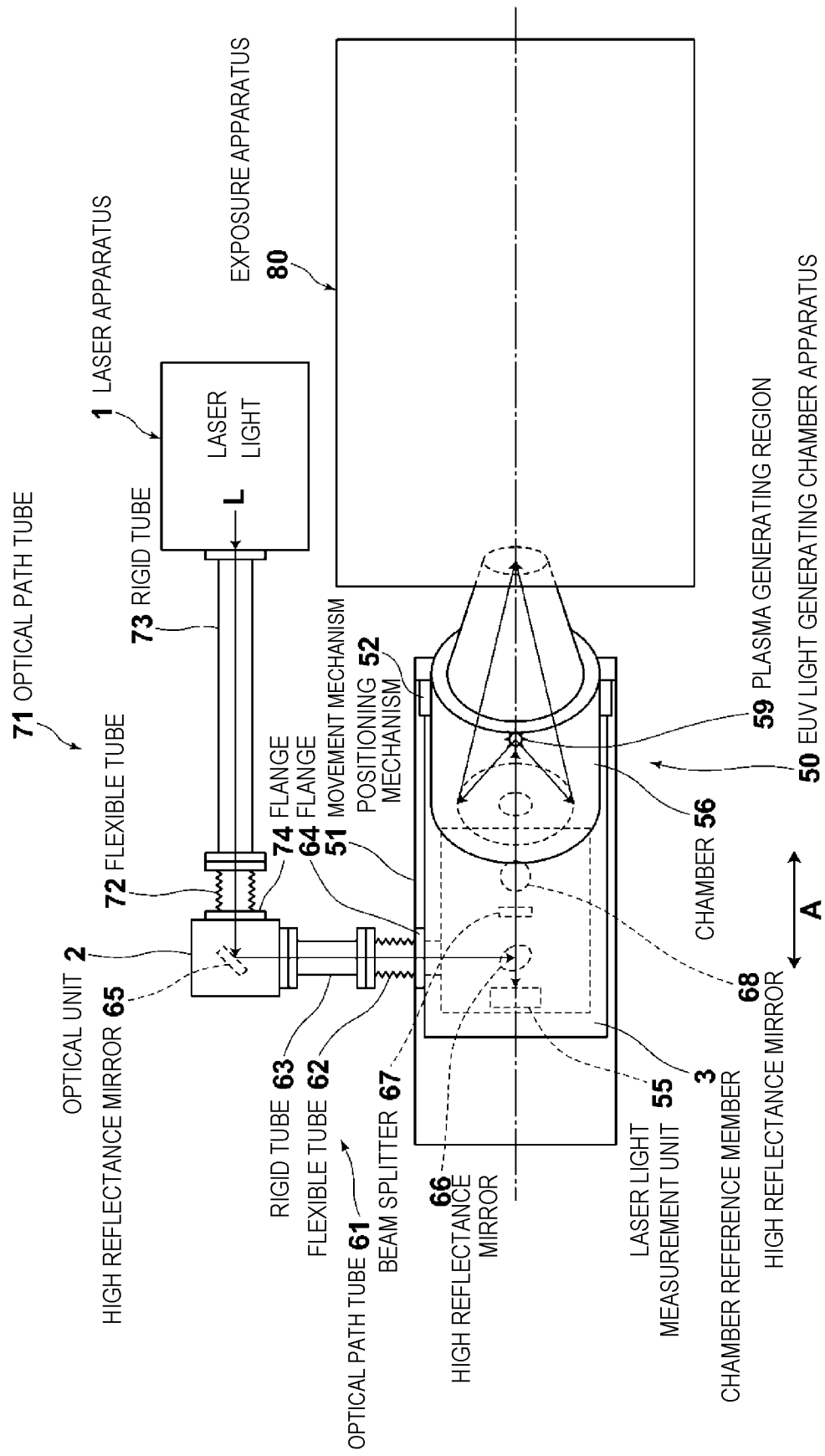
[FIG. 23]

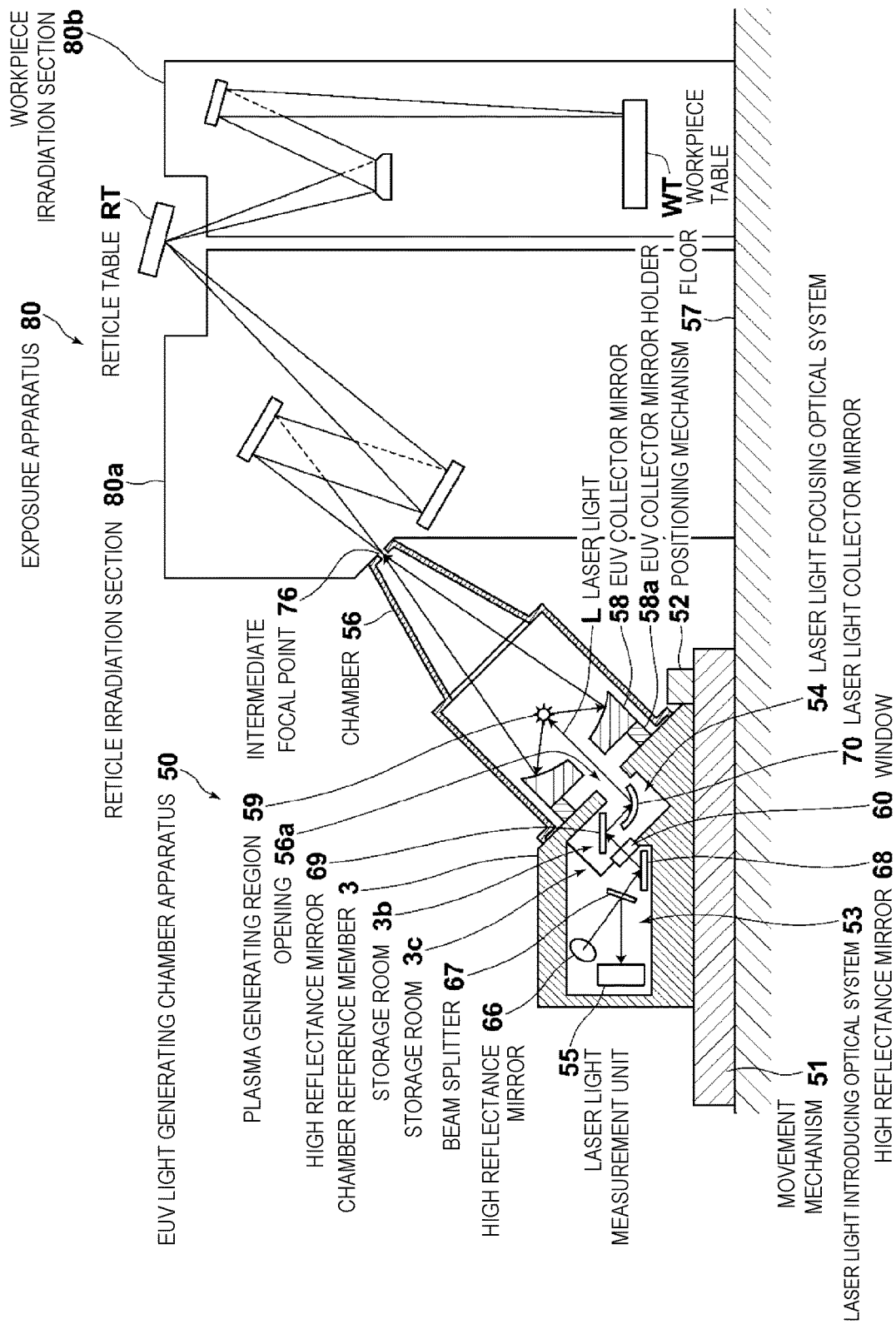
[FIG. 24]

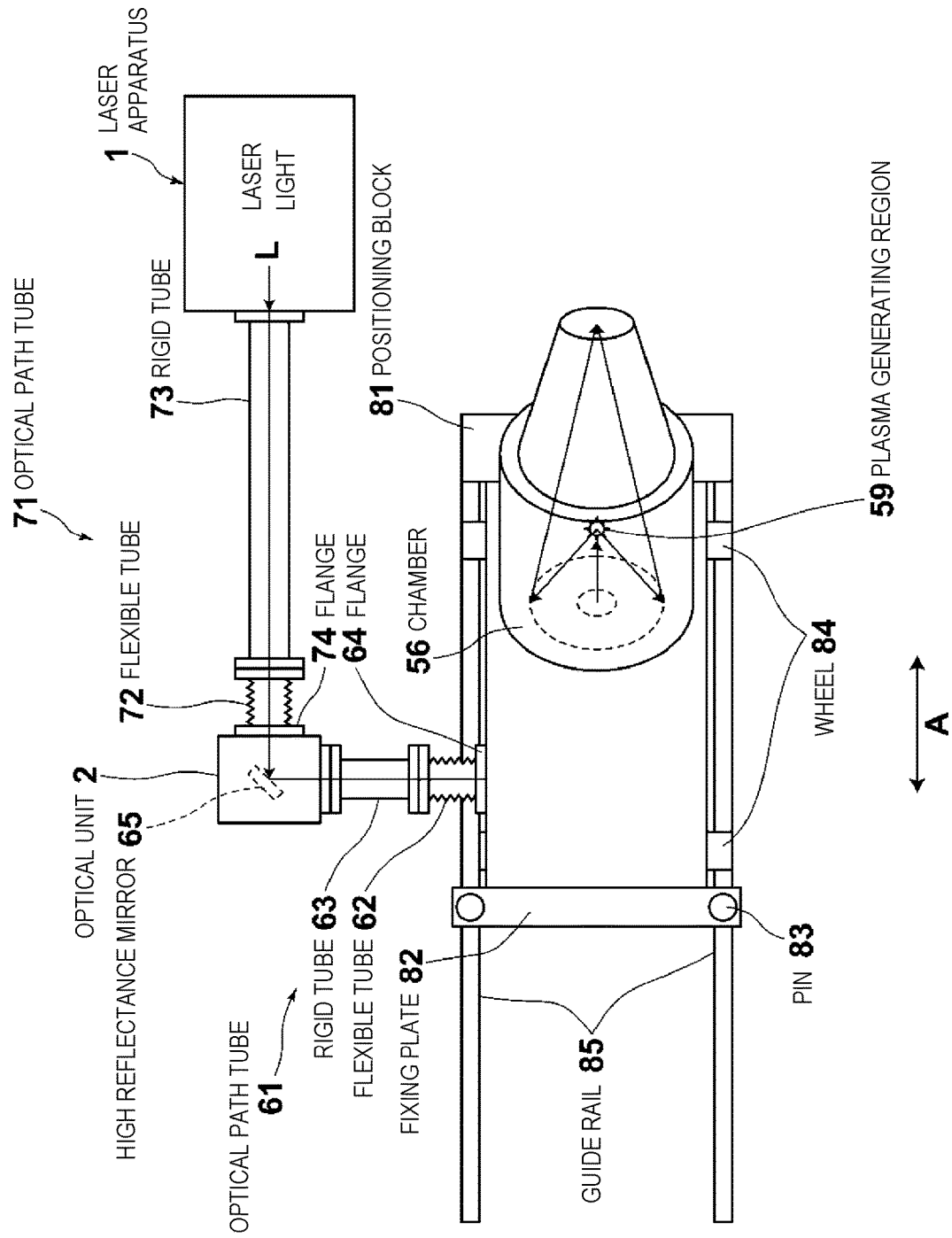
[FIG. 25]

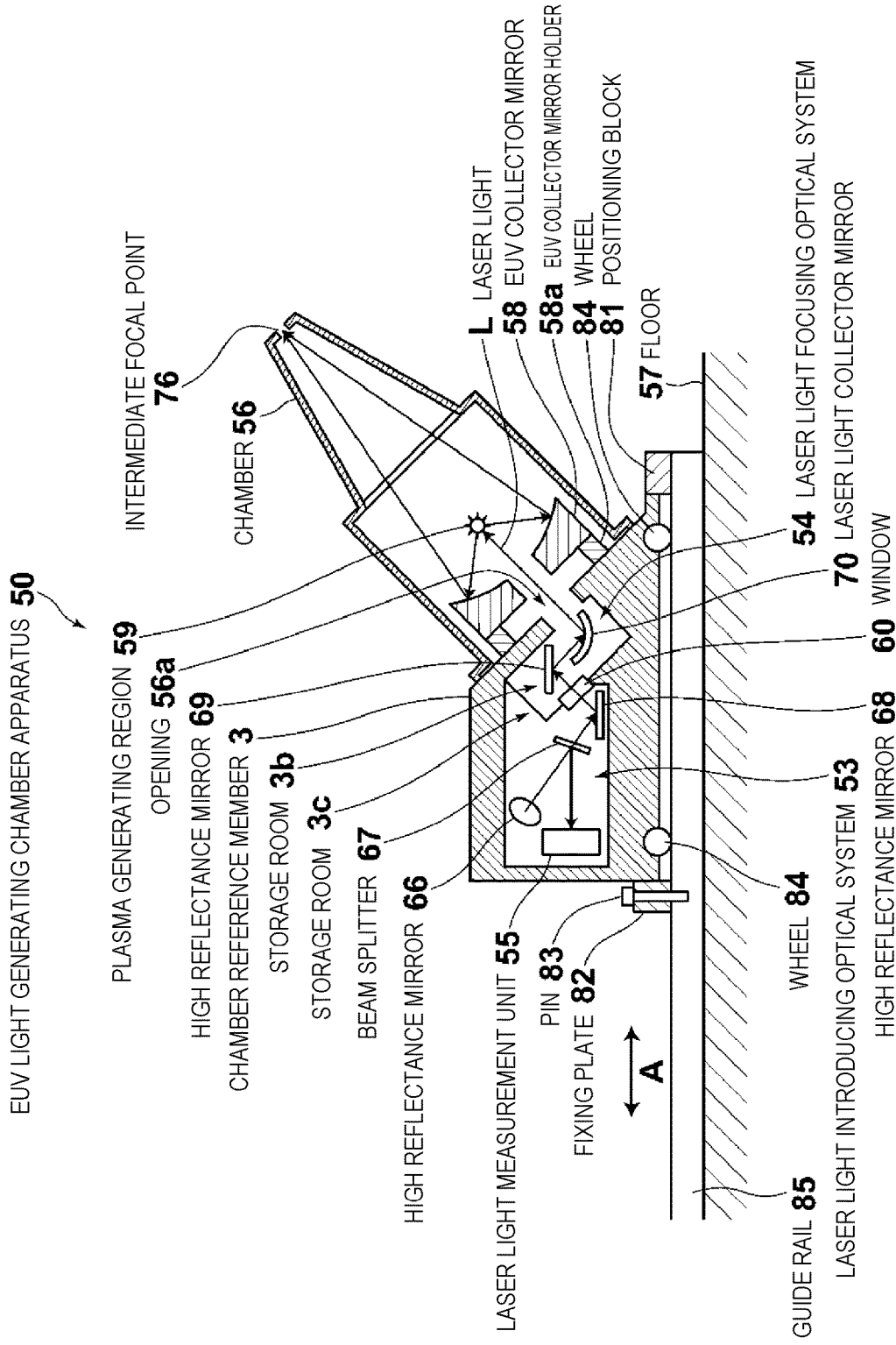
[FIG. 26]

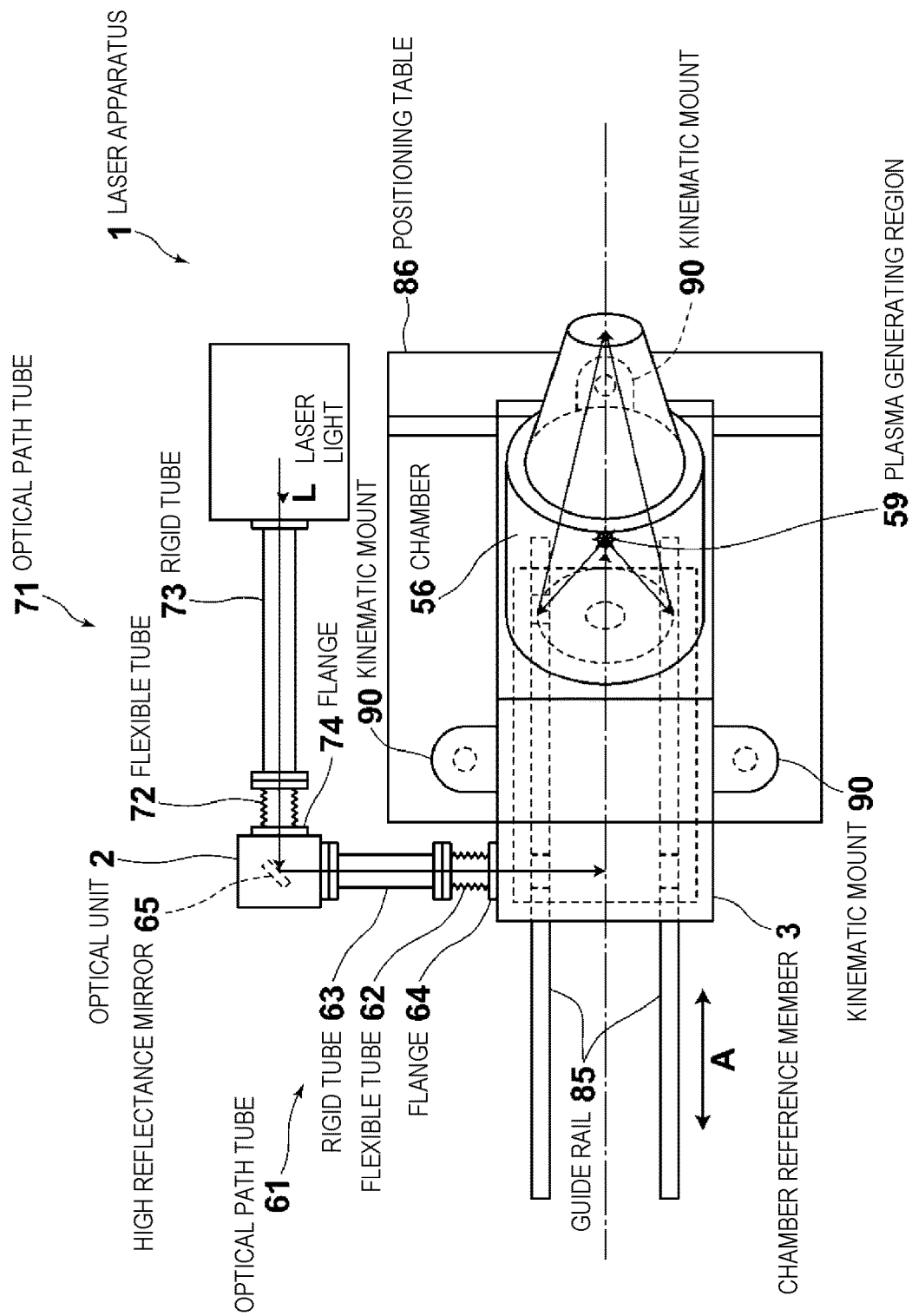
[FIG. 27]

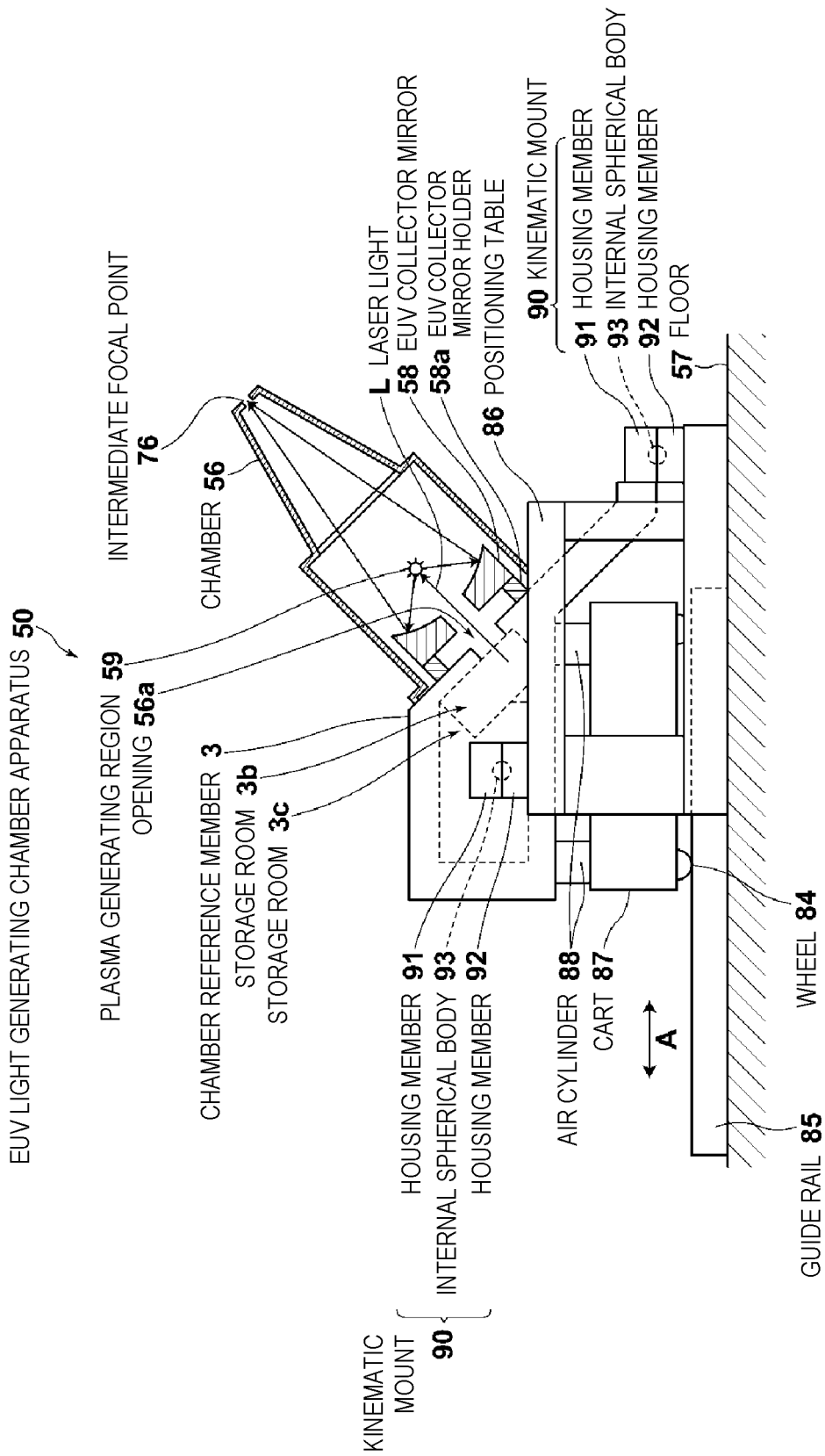
[FIG. 28]

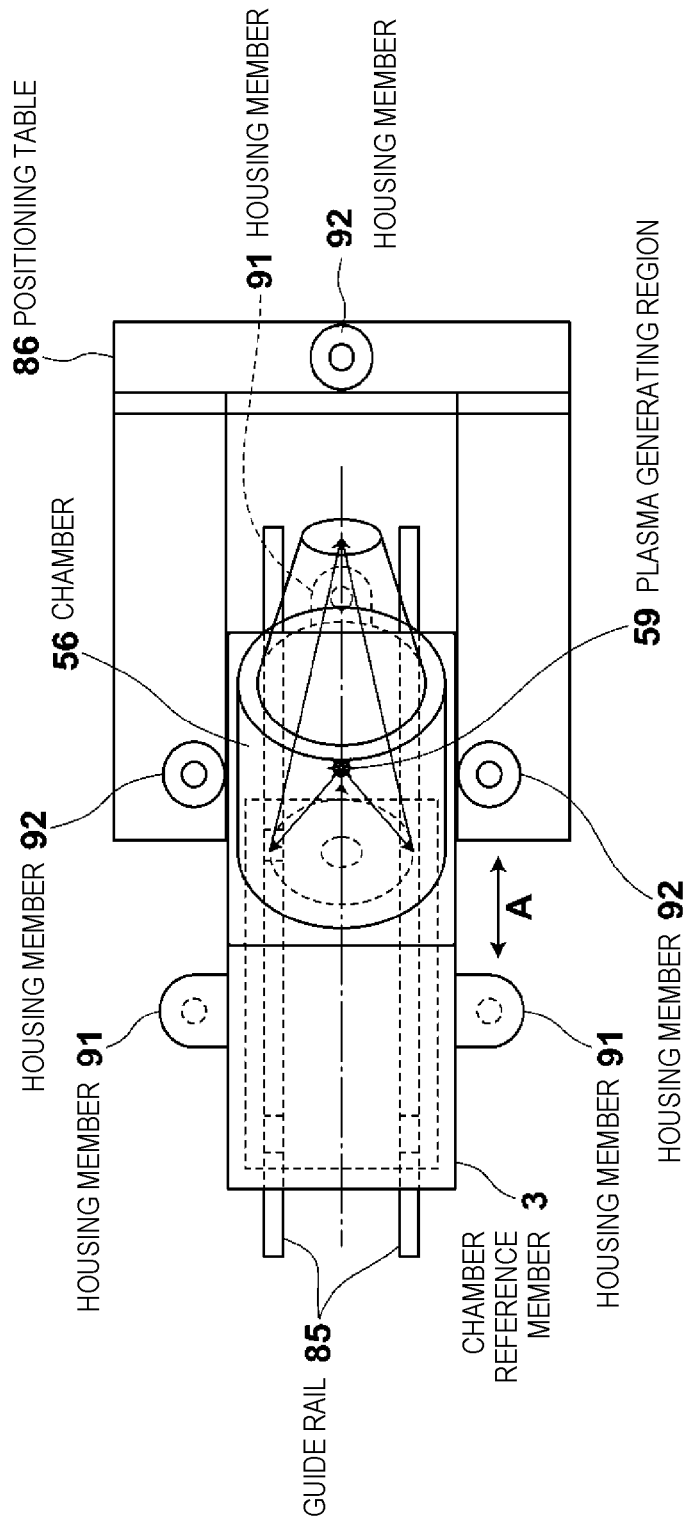

[FIG. 30]
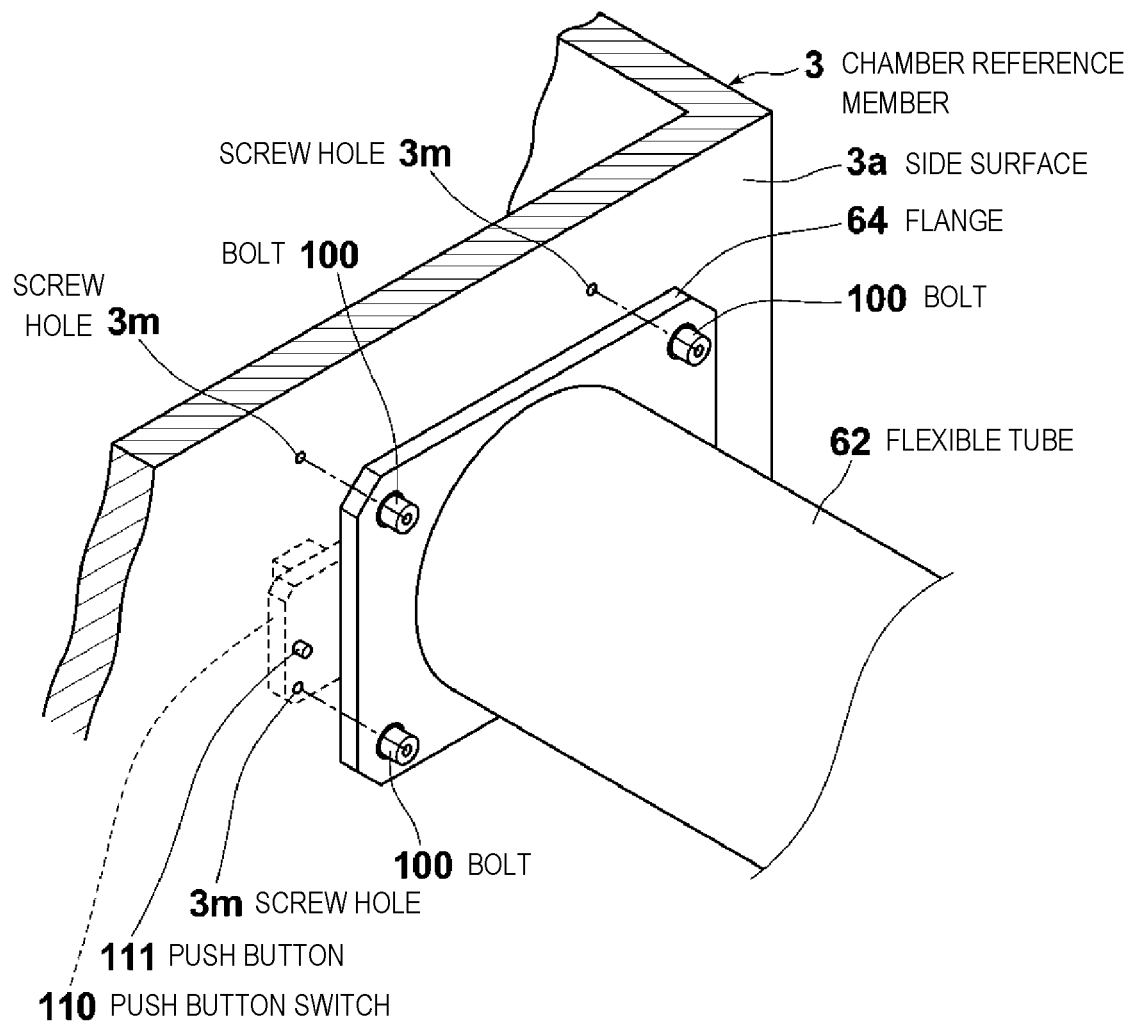

STRUCTURE OF CONNECTION BETWEEN OPTICAL UNIT AND OPTICAL PATH TUBE

CROSS-REFERENCE TO RELATED APPLICATIONS

The present application is a continuation application of International Application No. PCT/JP2016/057644 filed on Mar. 10, 2016. The content of the application is incorporated herein by reference in its entirety.

BACKGROUND

1. Technical Field

The present disclosure relates to a structure of connection between an optical unit and an optical path tube.

2. Related Art

In recent years, with the miniaturization of semiconductor process, the miniaturization of the transcription pattern in optical lithography of the semiconductor process has rapidly progressed. In the next generation, a fine processing of 20 nm or less will be demanded. Therefore, for meeting the demand of a fine processing of, for example, 20 nm or less, it is expected to develop an exposure apparatus in which an extreme ultraviolet light generating apparatus to generate an extreme ultraviolet (EUV) light with a wavelength of 13.5 nm and a reduced projection reflective optical system (reduced projection reflective optics) are combined.

As the EUV light generating apparatus, there have been proposed three types of apparatuses: an LPP (Laser Produced Plasma) type apparatus using plasma that is generated by irradiating a target material with a pulsed laser light, a DDP (Discharge Produced Plasma) type apparatus using plasma that is generated by discharge, and a free electron laser apparatus using electrons that are output from an electron accelerator.

CITATION LIST

Patent Literature

Patent Literature 1: Japanese Unexamined Patent Application Publication No. 2013-69655
Patent Literature 2: Japanese Unexamined Patent Application Publication No. 2005-241414
Patent Literature 3: Japanese Unexamined Patent Application Publication No. 2007-19083

SUMMARY

A structure of connection between an optical unit and an optical path tube according to an aspect of the present disclosure is a structure of connection between an optical unit and an optical path tube that is detachable from the optical unit, and includes an extensible tube, a flange, a flange receiving part, and a biasing part. The extensible tube constitutes at least a part of the optical path tube, and is extensible in a tube axis direction. The flange is attached to one end of the optical path tube. The flange receiving part is provided on the optical unit, and receives a front surface of the flange. The front surface of the flange is an end surface on an open side. The biasing part is configured to bias at least a part of the optical path tube in a direction in which the extensible tube extends.

BRIEF DESCRIPTION OF THE DRAWINGS

Some embodiments of the present disclosure, as just examples, will be described below, with reference to the accompanying drawings.

FIG. 1 is a partially-breakaway perspective view showing a structure of connection between an optical unit and an optical path tube according to Embodiment 1;

FIG. 2 is a perspective view showing a part of the structure of the connection between the optical unit and the optical path tube shown in FIG. 1;

FIG. 3 is a side view showing a part of the structure of the connection between the optical unit and the optical path tube shown in FIG. 1;

FIG. 4 is an elevation view showing a part of the structure of the connection between the optical unit and the optical path tube shown in FIG. 1;

FIG. 5 is a partially-breakaway side view showing a part of the structure of the connection between the optical unit and the optical path tube shown in FIG. 1;

FIG. 6 is an elevation view showing a part of the structure of the connection between the optical unit and the optical path tube shown in FIG. 1;

FIG. 7 is a partially-breakaway top view showing a part of the structure of the connection between the optical unit and the optical path tube shown in FIG. 1;

FIG. 8 is a side view showing an extensible tube that is used in the structure of the connection between the optical unit and the optical path tube shown in FIG. 1;

FIG. 9 is a side view showing another example of an extensible tube that can be used in the structure of the connection between the optical unit and the optical path tube shown in FIG. 1;

FIG. 10 is a perspective view showing a structure of the connection between the optical unit and the optical path tube according to Embodiment 2;

FIG. 11 is an elevation view showing the structure of the connection between the optical unit and the optical path tube shown in FIG. 10;

FIG. 12 is an elevation view showing the structure of the connection between the optical unit and the optical path tube shown in FIG. 11 that is in a different state from that in FIG. 11;

FIG. 13 is a perspective view showing a structure of the connection between the optical unit and the optical path tube according to Embodiment 3;

FIG. 14 is an elevation view showing the structure of the connection between the optical unit and the optical path tube shown in FIG. 13;

FIG. 15 is an elevation view showing the structure of the connection between the optical unit and the optical path tube shown in FIG. 14 that is in a different state from that in FIG. 14;

FIG. 16 is a cross sectional side view showing an extensible tube in Modification 1;

FIG. 17 is a cross sectional side view showing an extensible tube in Modification 2;

FIG. 18 is a cross sectional side view showing an extensible tube in Modification 3;

FIG. 19 is a cross sectional side view showing an extensible tube in Modification 4;

FIG. 20 is a cross sectional side view showing an extensible tube in Modification 5;

FIG. 21 is a cross sectional side view showing an extensible tube in Modification 6;

FIG. 22 is a graph showing an example of the relation between intensity of light beam and beam radius;

FIG. 23 is a plan view showing an exemplary EUV (extreme ultraviolet) light generating chamber apparatus and an exemplary exposure apparatus;

FIG. 24 is a cross sectional side view showing the EUV (extreme ultraviolet) light generating chamber apparatus and exposure apparatus shown in FIG. 23;

FIG. 25 is a plan view showing an apparatus that is the EUV light generating chamber apparatus shown in FIG. and that includes a movement mechanism of a first example;

FIG. 26 is a cross sectional side view showing the EUV light generating chamber apparatus shown in FIG. 25;

FIG. 27 is a plan view showing an apparatus that is the EUV light generating chamber apparatus shown in FIG. and that includes a movement mechanism of a second example;

FIG. 28 is a cross sectional side view showing the EUV light generating chamber apparatus shown in FIG. 27;

FIG. 29 is a plan view showing the EUV light generating chamber apparatus shown in FIG. 27 that is in another state; and FIG. 30 is a perspective view showing a part of a structure of connection between an optical unit and an optical path tube in a comparative example.

DETAILED DESCRIPTION OF THE PREFERRED EMBODIMENTS

<Contents>
1. Terms
2. Overall Description of EUV Light Generating Chamber Apparatus and Exposure Apparatus
   2.1 Configuration
   2.2 Operation
   2.3 Effect
3. First Example of Movement Mechanism of EUV Light Generating Chamber Apparatus
   3.1 Configuration
   3.2 Operation
   3.3 Effect
4. Second Example of Movement Mechanism of EUV Light Generating Chamber Apparatus
   4.1 Configuration
   4.2 Operation
   4.3 Effect
5. Comparative Example
   5.1 Configuration of Comparative Example
   5.2 Problem of Comparative Example
6. Embodiment 1
   6.1 Configuration of Embodiment 1
   6.2 Operation of Embodiment 1
   6.3 Effect of Embodiment 1
7. Embodiment 2
   7.1 Configuration of Embodiment 2
   7.2 Operation of Embodiment 2
   7.3 Effect of Embodiment 2
8. Embodiment 3
   8.1 Configuration of Embodiment 3
   8.2 Operation of Embodiment 3
   8.3 Effect of Embodiment 3
9. Modification 1 of Extensible Tube
   9.1 Configuration of Modification 1 of Extensible Tube
   9.2 Operation of Modification 1 of Extensible Tube
   9.3 Effect of Modification 1 of Extensible Tube
10. Modification 2 of Extensible Tube
    10.1 Configuration of Modification 2 of Extensible Tube
    10.2 Effect of Modification 2 of Extensible Tube
11. Modification 3 of Extensible Tube
    11.1 Configuration of Modification 3 of Extensible Tube
    11.2 Effect of Modification 3 of Extensible Tube
12. Modification 4 of Extensible Tube
    12.1 Configuration of Modification 4 of Extensible Tube
    12.2 Effect of Modification 4 of Extensible Tube
13. Modification 5 of Extensible Tube
    13.1 Configuration of Modification 5 of Extensible Tube
    13.2 Effect of Modification 5 of Extensible Tube
14. Modification 6 of Extensible Tube
    14.1 Configuration of Modification 6 of Extensible Tube
    14.2 Effect of Modification 6 of Extensible Tube
15. Example of Optical Path Tube
    15.1 Configuration of Example of Optical Path Tube Hereinafter, embodiments of the present disclosure will be described in detail, with reference to the drawings.

The embodiments described below show some examples of the present disclosure, and do not limit the content of the present disclosure. Further, all of the configurations and operations described in the embodiments are not necessarily essential as the configuration and operation of the present disclosure. Identical elements are denoted by identical reference symbols, and repetitive descriptions are omitted (the same applies hereinafter).

1. Terms

"BS black" is a surface treatment that is performed to a stainless steel made by ABEL Co., Ltd, specifically, a treatment for applying a black oxide layer to the stainless steel.

2. Overall Description of EUV Light Generating Chamber Apparatus and Exposure Apparatus 2.1 Configuration FIG. 23 is a plan view showing an EUV (extreme ultraviolet) light generating chamber apparatus 50 as a first typical example and an exposure apparatus 80 connected with the EUV light generating chamber apparatus 50. FIG. 24 is a cross sectional side view showing the EUV light generating chamber apparatus 50 and exposure apparatus 80 shown in FIG. 23, taken along a vertical plane containing a chain line in FIG. 23.

As shown in FIGS. 23 and 24, the EUV light generating chamber apparatus 50 includes a movement mechanism 51, a positioning mechanism 52, a chamber reference member 3, a laser light introducing optical system 53, a laser light focusing optical system 54, a laser light measurement unit 55, and a chamber 56. The surface of a floor 57 shown in FIG. 24 is a reference plane for the installation for the EUV light generating chamber apparatus 50, the exposure apparatus 80, and the like.

The movement mechanism 51 is installed on the surface of the floor 57. The chamber reference member 3 as an optical unit is supported by the movement mechanism 51. The main part of the EUV light generating chamber apparatus 50 can move in the direction of an arrow A together with the movement mechanism 51, relative to the exposure apparatus 80. Examples of the structure for the movement will be described later. The positioning of the chamber reference member 3 is performed by the positioning mechanism 52, and in this state, the EUV light generating chamber apparatus 50 is connected with the exposure apparatus 80.

As shown in FIG. 24, the chamber 56 is provided with an opening 56a for introducing a laser light with which a target material is irradiated. The chamber 56 is mounted on the chamber reference member 3 such that the opening 56a is covered with the chamber reference member 3. For example, an inclined surface is formed on the chamber reference member 3, and the chamber 56 is fixed on the inclined surface.

In the chamber 56, an EUV collector mirror 58 is disposed. Further, an unillustrated target supply device is attached to the chamber 56. The target supply device is fixed, for example, to the chamber 56, and supplies a target to a plasma generating region 59.

The EUV collector mirror 58 is fixed to the inclined surface of the chamber reference member 3, for example, by an EUV collector mirror holder 58*a*.

Preferably in the chamber 56, the EUV collector mirror 58 should be fixed to the inclined surface of the chamber reference member 3 by the EUV collector mirror holder 58*a*. The EUV collector mirror 58 is a mirror having a spheroidal reflecting surface, for example, and is disposed such that a first focal point is positioned in the plasma generating region 59 and a second focal point is positioned at an intermediate focal point (IF) 76. Furthermore, optical elements such as the laser light introducing optical system 53, the laser light focusing optical system 54, and the laser light measurement unit 55 should be also fixed, preferably to the chamber reference member 3.

The chamber reference member 3 includes a storage room 3*b* that is in communication with the opening 56*a* of the chamber 56 through a through-hole and a storage room 3*c* that is adjacent to the storage room 3*b*. In the storage room 3*b*, for example, the laser light focusing optical system 54 is stored. In the storage room 3*c*, for example, optical elements such as the laser light introducing optical system 53 and the laser light measurement unit 55 are stored. Between the storage room 3*b* and the storage room 3*c*, a window 60 is provided. By providing the window 60, the gas in the chamber 56 is confined, and the pressure in the chamber 56 is maintained.

The chamber reference member 3 is connected with an optical unit 2 through an optical path tube 61. The optical unit 2 includes one high reflectance mirror 65 in the interior, for example. The optical unit 2 is connected with a laser apparatus 1 as an example of the optical unit, through another optical path tube 71.

The optical path tube 61 includes a flexible tube (extensible tube) 62 and a rigid tube 63 connected with the flexible tube 62 through a flange. A flange 64 is fixed to one end of the flexible tube 62, more specifically, one end on the side opposite to the rigid tube 63. The optical path tube 71, similarly to the optical path tube 61, includes a flexible tube (extensible tube) 72 and a rigid tube 73 connected with the flexible tube 72 through a flange. A flange 74 is fixed to one end of the flexible tube 72, more specifically, one end on the side opposite to the rigid tube 73.

The above "rigid tube" means a tube that has such a high rigidity that a bend or elastic deformation does not occur under usual usage conditions. The structure of the connection of the chamber reference member 3 and the optical unit 2 with the optical path tube 61 and the structure of the connection of the optical unit 2 and the laser apparatus 1 with the optical path tube 71 will be described later in detail.

The laser light introducing optical system 53 includes a high reflectance mirror 66 that reflects a laser light L having entered the storage room 3*c*, a beam splitter 67, a high reflectance mirror 68, and a holder that holds these optical elements. The laser light focusing optical system 54 includes a high reflectance mirror 69, a laser light collector mirror 70 that is, for example, an off-axis parabolic mirror, and a holder that holds these mirrors.

Next, the exposure apparatus 80 will be described mainly with reference to FIG. 24. The exposure apparatus includes a reticle irradiation section 80*a* and a workpiece irradiation section 80*b*. The reticle irradiation section 80*a* is an optical system for irradiating a reticle on a reticle table RT with an EUV light, and for example, is configured as a reflective optical system that includes a plurality of high reflectance mirrors. The workpiece irradiation section 80*b* is an optical system for projecting the image of the reticle on a workpiece on a workpiece table WT, and for example, is configured as a reflective optical system that includes a plurality of high reflectance mirrors. Typical examples of the workpiece include a semiconductor wafer.

2.2 Operation

The laser light L is output from the laser apparatus 1. The laser light L goes in the optical path tube 71, and enters the optical unit 2. The laser light L is reflected by the high reflectance mirror 65 in the optical unit 2. Then, the laser light L goes in the optical path tube 61, and enters the storage room 3*c* of the chamber reference member 3. Thus, the laser light L is supplied to the laser light introducing optical system 53 in the storage room 3*c*.

The high reflectance mirror 66 of the laser light introducing optical system 53 reflects the supplied laser light L toward the beam splitter 67. Most of the laser light L having entered the beam splitter 67 goes through the beam splitter 67, and enters the high reflectance mirror 68. Some of the laser light L having entered the beam splitter 67 is reflected by the beam splitter 67, and enters the laser light measurement unit 55. The laser light measurement unit 55 measures the cross sectional intensity profile, pointing, spread angle and others of the laser light L.

The laser light L having entered the high reflectance mirror 68 is reflected by the high reflectance mirror 68. The reflected laser light L goes through the window 60, and enters the laser light focusing optical system 54. The laser light L is reflected by the high reflectance mirror 69 and laser light collector mirror 70 of the laser light focusing optical system 54. Then, the laser light L passes through the through-hole formed on the chamber reference member 3, and enters the opening 56*a* of the chamber 56. The laser light L having entered the opening 56*a* passes through a through-hole formed at the center of the EUV collector mirror 58, and focuses on the plasma generating region 59 by the effect of the laser light collector mirror 70.

The target material output from the above-described target supply device is supplied to the plasma generating region 59. Hence, the target material is irradiated with the laser light L focusing on the plasma generating region 59. Thereby, the target material can be put into a plasma state, and the EUV light can be generated. The generated EUV light focuses on the intermediate focal point 76 by the EUV collector mirror 58, and enters the exposure apparatus 80.

With the EUV light focusing on the intermediate focal point 76, the reticle on the reticle table RT is irradiated through the reflective optical system of the reticle irradiation section 80*a*, in the exposure apparatus 80. The EUV light is reflected by the reticle. The reflected EUV light forms an image on the workpiece on the workpiece table WT, through the reflective optical system of the workpiece irradiation section 80*b*. Then, the reticle table RT and the workpiece table WT move and scan in synchronization with each other, and thereby, the whole of the pattern of the reticle can be transcribed on the workpiece.

2.3 Effect

In the apparatus of this example, the EUV collector mirror 58, the laser light focusing optical system 54, and the laser light introducing optical system 53 are fixed to the chamber reference member 3. Therefore, it is possible to reduce the position aberration between a focal point of the laser light L and a first focal point of the EUV collector mirror 58.

3. First Example of Movement Mechanism of EUV Light Generating Chamber Apparatus

3.1 Configuration

FIG. 25 is a plan view showing an EUV light generating chamber apparatus that includes a movement mechanism of a first example as the movement mechanism 51 shown in FIG. 23. FIG. 26 is a cross sectional side view of the EUV light generating chamber apparatus shown in FIG. 25. In the configuration shown in FIGS. 25 and 26, elements identical to elements shown in FIGS. 23 and 24 are denoted by identical reference symbols, and repetitive descriptions of them are omitted.

In this example, a plurality of wheels 84 and a plurality of guide rails 85 are used as the movement mechanism 51 shown in FIG. 23. As an example, two guide rails 85 are installed on the floor 57 as the reference plane. The wheels 84 are attached to the chamber reference member 3, in a rotatable manner. Instead of the wheels 84, casters including wheels, or the like may be used. Further, a positioning block 81, a fixing plate 82, and pins 83 are used as the positioning mechanism 52 shown in FIG. 23. Instead of the pins 83, bolts or the like may be used.

3.2 Operation

In the above configuration, the wheels 84 rotate on the two guide rails 85. Thereby, the chamber reference member 3 and the chamber 56, which constitute the main part of the EUV light generating chamber apparatus, can move in the direction of the arrow A, relative to the exposure apparatus 80.

The front end surface of the chamber reference member 3 on the exposure apparatus side, that is, the end surface on the right side in the figure abuts on the positioning block 81, and thereby, the positioning of the chamber reference member 3 can be performed. Instead of or in addition to this, the fixing plate 82 may abut on the rear end surface on the side opposite to the above front end surface of the chamber reference member 3, that is, the end surface on the left side in the figure, and the fixing plate 82 may be fixed to the guide rails 85 by the pins 83. Thereby, the movement of the chamber reference member 3 after the positioning may be prevented.

3.3 Effect

By using the plurality of wheels 84 and the plurality of guide rails 85 as described above, it is possible to facilitate the movement of the chamber reference member 3. Therefore, it is possible to precisely adjust the position of the chamber reference member 3 relative to the exposure apparatus 80, and further, it is possible to precisely adjust the position of the EUV collector mirror 58 relative to the exposure apparatus 80.

4. Second Example of Movement Mechanism of EUV Light Generating Chamber Apparatus

4.1 Configuration

FIG. 27 is a plan view showing an EUV light generating chamber apparatus that includes a movement mechanism of a second example as the movement mechanism 51 shown in FIG. 23. FIG. 28 is a cross sectional side view of the EUV light generating chamber apparatus shown in FIG. 27. FIG. 29 is a plan view showing the EUV light generating chamber apparatus that is in a different state from that in FIG. 27. In the configuration shown in FIGS. 27 to 29, elements identical to elements shown in FIGS. 25 and 26 are denoted by identical reference symbols, and repetitive descriptions of them are omitted.

In this example, a plurality of guide rails 85 and a cart 87 including a plurality of wheels 84 and a plurality of air cylinders 88 are used as the movement mechanism 51 shown in FIG. 23. As an example, two guide rails 85 are installed on the floor 57 as the reference plane. The chamber reference member 3 is placed on the air cylinders 88 of the cart 87. The wheels 84 are attached to the cart 87, in a rotatable manner.

Further, a positioning table 86 is used as the positioning mechanism 52 shown in FIGS. 23 and 24. The chamber reference member 3 is disposed on the positioning table 86 through at least three kinematic mounts 90. Each of the kinematic mounts 90 includes a housing member integrated with or fixed to the chamber reference member 3, a housing member 92 integrated with or fixed to the positioning table 86, and an internal spherical body 93 disposed between the housing member 91 and the housing member 92. The internal spherical body 93 may be disposed between the housing member 92 and the housing member 91, while an elastic member such as a rubber and a spring is interposed. In the case where the elastic member is not provided, some of the housing members 92 may be configured to include a V-groove at a portion that contacts with the internal spherical body 93.

4.2 Operation

In the above configuration, the wheels 84 rotate on the two guide rails 85. Thereby, the chamber reference member 3 and the chamber 56, which constitute the main part of the EUV light generating chamber apparatus, can move in the direction of the arrow A, relative to the exposure apparatus 80.

In the state shown in FIG. 29, the positioning between the positioning table 86 and the chamber reference member 3 by the kinematic mounts 90 is not performed. When the chamber reference member 3 and the chamber 56 move in the rightward direction in the figure so that they are put into the state in FIG. 27 from the state in FIG. 29, the positioning between the positioning table 86 and the chamber reference member 3 is performed by the kinematic mounts 90. That is, the housing member and the housing member 92 are engaged while the internal spherical body 93 is interposed between them, and thereby, the above positioning is performed. When the housing member 91 and the housing member 92 are engaged, the chamber reference member 3 may be let down using the air cylinders 88 of the cart 87. Thereby, the chamber reference member 3 is positioned and supported by the positioning table 86, with the kinematic mounts 90.

4.3 Effect

In this example, it is possible to precisely set the position of the chamber reference member 3 relative to the positioning table 86, because the kinematic mounts 90 absorb structural distortions, thermal distortions and others that occur between the positioning table 86 and the chamber reference member 3.

5. Comparative Example

5.1 Configuration of Comparative Example

The structure of the connection between the chamber reference member 3 and the optical path tube 61 shown in FIGS. 23 to 27 is a comparative example of the present disclosure. That is, in the connection structure of the comparative example, the flange 64 is fixed to one end of the flexible tube 62 that constitutes a part of the optical path tube 61 and that is extensible in the tube axis direction. Further, as shown in FIG. 30, the flange 64 is fixed to a side surface 3a of the chamber reference member 3, for example, using four bolts 100. More specifically, the bolts 100 are inserted into four unillustrated bolt insertion holes provided on the flange 64, respectively, and the bolts 100 are tightened to four screw holes 3m provided on the side surface 3a, respectively. In this way, the optical path tube 61 is connected with the chamber reference member 3 as the optical unit, in a detachable manner.

Further, a push button switch 110 is attached to the back side of the side surface 3a of the chamber reference member 3, and a push button 111 of the push button switch 110 protrudes from the surface of the side surface 3a. Therefore, when the flange 64 is fixed to the chamber reference member 3 as described above, the flange 64 pushes the push button 111, and the push button switch 110 can output a signal indicating that the optical path tube 61 has been connected with the chamber reference member 3. Accordingly, when the optical path tube 61 is carelessly detached from the chamber reference member 3, it is possible to detect the detachment of the optical path tube 61, because the output signal of the push button switch 110 changes.

5.2 Problem of Comparative Example

The structure of the connection between the chamber reference member 3 and the optical path tube 61 as the comparative example requires a burdensome operation such as the tightening or loosening of the bolts 100, for attaching or detaching the optical path tube 61. Hence, it is desired to simplify the operation for attaching or detaching the optical path tube 61. In the case where the chamber reference member 3 is movable as described above, it is necessary to attach or detach the optical path tube 61 for each movement, and therefore, it is particularly desired to simplify the operation for attaching or detaching the optical path tube 61.

6. Embodiment 1

6.1 Configuration of Embodiment 1

Next, a structure of the connection between the optical unit and the optical path tube according to Embodiment 1 will be described with reference to FIG. 1 to FIG. 8. FIG. 1 is a partially-breakaway perspective view showing the structure of the connection between the optical unit and the optical path tube according to Embodiment 1. In Embodiment 1, the present disclosure is applied to the structure of the connection of the optical path tube 71 with the laser apparatus 1 and the optical unit 2 and the structure of the connection of the optical path tube 61 with the optical unit 2 and the chamber reference member 3. The two structures have basically an identical configuration, and therefore, as an example, the structure of the former will be described below in detail.

In the embodiment, another optical path tube 171 is provided roughly parallel to the optical path tube 71, and another optical path tube 161 is provided roughly parallel to the optical path tube 61. The connection structures of the optical path tubes 161, 171 are also the same as the connection structure of the above two optical path tubes 61, 71. Hence, in the following, in the description of the structure of the connection of the optical path tube 71 with the laser apparatus 1 and the optical unit 2, the connection structure of the optical path tube 171 will be described when appropriate, only if the description is particularly necessary.

The optical path tube 171 is used for transmitting a pre-pulsed laser light, for example. The pre-pulsed laser light is a laser light for irradiating a primary target and generating a secondary target. In this case, a main pulsed laser light for irradiating the secondary target and generating plasma is transmitted, for example, through the optical path tube 71.

The laser apparatus 1, the optical unit 2, the chamber reference member 3, the optical path tube 61, and the optical path tube 71, for example, are the same as those in FIGS. 23 to 27 described above. Each of the laser apparatus 1 and the chamber reference member 3 is one optical unit that is specified in the present disclosure.

As shown in FIG. 1, one end part of each of the optical path tube 71 and the optical path tube 171 is connected with a side surface 1a of the laser apparatus 1, at a connection part is provided on the side surface 1a of the laser apparatus 1. Although not illustrated in the figure, the same connection part as the above connection part 1c is provided also on a side surface 2a of the optical unit 2, and the other end part of each of the optical path tube 71 and the optical path tube 171 is connected with the side surface 2a at the connection part.

Further, the same connection part as the above connection part 1c is provided also on a side surface 3a of the chamber reference member 3, and one end part of each of the optical path tube 61 and the optical path tube 161 is connected with the side surface 3a at the connection part. Although not illustrated in the figure, the same connection part as the above connection part 1c is provided also on a side surface 2b of the optical unit 2, and the other end part of each of the optical path tube 61 and the optical path tube 161 is connected with the side surface 2b at the connection part. The optical path tube 71 and the optical path tube 171 are supported between the laser apparatus 1 and the optical unit 2, for example, by two support legs 75, on the lower side in the vertical direction.

FIG. 2 is a perspective view showing the structure of the connection between the optical path tubes 71, 171 and the optical unit 2 that is extracted from the configuration shown in FIG. 1. FIG. 2 is an enlarged perspective view showing the connection part 1c and the optical path tube 71. As shown in the figure, the optical path tube 71 includes the extensible tube 72 that is, for example, a bellows tube, and the rigid tube 73. That is, the optical path tube 71 has one end part provided with the extensible tube 72. More specifically, flanges 72f, 73f are respectively attached to end parts where the extensible tube 72 and the rigid tube 73 face each other, and the flanges 72f, 73f are connected by a plurality of special bolts 10, so that the extensible tube 72 and the rigid tube 73 are integrated. Further, for example, two gas inlet ports 11 for introducing gas into the internal space of the rigid tube 73 are attached to the rigid tube 73. As the rigid tube 73, for example, a tube made of stainless steel or aluminum can be suitably used.

A blacking process has been performed to inner surfaces of the extensible tube 72 and the rigid tube 73. As the blacking process for the extensible tube 72 that is a bellows tube, it is preferable to apply, for example, a black oxide layer having a film thickness of 1 μm (BS black). On the other hand, as the blacking process for the rigid tube 73 made of stainless steel or aluminum, it is preferable to apply, for example, an inorganic black alumite film having a film thickness of 20 μm.

FIGS. 3 and 4 are an exploded side view and an exploded elevation view showing the configuration of the connection part 1c. FIGS. 5 and 6 are a side view and an elevation view showing a state where the laser apparatus and the optical path tube 71 are connected at the connection part 1c. FIG. 7 is a partially-breakaway top view showing a state where the laser apparatus 1 and the optical path tube 71 are connected at the connection part 1c. The configuration of the connection part 1c will be described below in detail, with reference to FIG. 3 to FIG. 7.

A flange receiving part 20 having a through-hole 20a for making the laser light L pass therethrough is fixed to the side surface 1a of the laser apparatus 1, for example, by screwing. The surface of the flange receiving part 20 on the side opposite to the side surface 1a is a flange receiving surface 20b. To the flange receiving surface 20b, a receiving plate 21 is fixed by screwing, similarly. As shown in FIG. 4, the receiving plate 21 has a cutout 21a for making the extensible tube 72 pass therethrough. The cutout 21a has a portion that tightly contacts with an outer surface of the extensible tube 72. The "outer surface" is not an outer surface of a portion where the bellows is formed but an outer surface of a straight tube portion 72a that is formed, for example, at an end part of the extensible tube 72. Further, a portion of the receiving plate 21 near the cutout 21a is formed so as to depart from the flange receiving surface 20b. Thereby, a concave part 22 is configured between the flange receiving surface 20b and the receiving plate 21. The concave part 22 is a flange accommodating part that accommodates the flange 26.

A plurality of plungers 23 is attached to the receiving plate 21. Each plunger 23 is biased by an unillustrated spring, such that the front end as the left end in FIG. 3 sticks out to the side of the concave part 22 by elastic force. As an example, two plungers 23 are disposed at each portion near the cutout 21a, and in total, four plungers 23 are provided for the optical path tube 71. It is preferable to provide at least two plungers 23 for one flange 26. Further, it is preferable to provide the plungers 23 symmetrically with respect to the flange 26.

Further, a limit switch 24 is attached to a portion of the receiving plate 21 below the cutout 21a. The limit switch 24 is connected with a wire 24a for outputting a detection signal. Further, a cover 25 that covers the limit switch 24 and that is made of, for example, a transparent resin is attached to the receiving plate 21.

The flange 26 for the connection of the optical path tube is attached to one end of the extensible tube 72, more exactly, one end on the side opposite to the side connected with the rigid tube 73. The flange 26 may be attached to the extensible tube 72 by welding or the like, or may be made integrally with the extensible tube 72. Further, an operation tab (dog) 27 for operating the limit switch 24 is attached to the extensible tube 72, so as to protrude downward.

Furthermore, there is provided a pressing plate 28 that is put into the concave part 22 from the upper side and that is engaged with the receiving plate 21. The pressing plate 28 is formed so as to have an arc-shaped pressing surface 28a at lower end parts. The pressing plate 28 is attached to the flange receiving part 20 by a plurality of bolts 29. Therefore, the pressing plate 28 can be easily detached from the flange receiving part 20 by loosening the bolts 29. By providing the pressing plate 28, it is possible to prevent the laser light L from leaking to the exterior through the space between the flange receiving part 20 and the flange 26. It is preferable that the pressing plate 28 be made of stainless steel and electroless nickel plating be performed to the surface on the side of the flange receiving surface 20b, because of an easy slide on the flange receiving surface 20b of the flange receiving part 20.

FIG. 8 is a side view showing the extensible tube 72 applied to the embodiment in detail. The figure shows only half of the extensible tube 72 taken along a plane containing the tube axis. As the extensible tube 72, a welded bellows tube is applied as an example. The welded bellows tube is a bellows tube that is obtained by cutting out a highly-elastic plate material such as, for example, a steel plate to make a plurality of ring members, and then processing the ring members into a bellows shape while alternately performing the welding of inner peripheral rims and the welding of outer peripheral rims. When an external force is given in the tube axis direction, this type of welded bellows tube is compressed, and in this state, biases itself in the direction in which the total length increases, because of the elasticity of the plate material.

The above-described structure for connecting the extensible tube 72 of the optical path tube 71 with the laser apparatus 1 is similarly applied for connecting the rigid tube 73 of the optical path tube 71 with the optical unit 2. FIG. 2 shows only the flange 26 fixed to the rigid tube 73, the receiving plate 21, the limit switch 24, the cover 25, and the pressing plate 28 of the elements constituting the structure.

As the extensible tube, an extensible tube 272 of a shaped bellows tube shown in FIG. 9 can be also applied, other than the welded bellows tube shown in FIG. 8. FIG. 9 shows only half of the extensible tube 272 taken along a plane containing the tube axis. The shaped bellows tube is a bellows tube that is obtained by rounding a metal plate, welding edge parts to make a straight tube, and then processing the straight tube into a bellows shape with a jig.

6.2 Operation of Embodiment 1

In the embodiment, the side of the extensible tube 72 is connected with the laser apparatus 1 and the side of the rigid tube 73 is connected with the optical unit 2, so that the optical path tube 71 is connected with the laser apparatus 1 and the optical unit 2. The connection of the side of the extensible tube 72 with the laser apparatus 1 will be described below.

On that occasion, first, the extensible tube 72 is disposed at a higher position than the flange receiving part 20. In the present disclosure, "high/low" and "upper/lower" are related to the vertical direction unless otherwise noted. Next, as described above, the extensible tube 72 is compressed, such that the total length of the optical path tube 71 is shorter than the distance between the side surface 1a of the laser apparatus 1 and the side surface 2a of the optical unit 2. From this state, as shown in FIG. 3, the front surface 26a as the end surface on the open side of the flange 26 is put into a state where the front surface 26a is matched with the flange receiving surface 20b of the flange receiving part 20, and the extensible tube 72 is moved in the vertical downward direction while that state is kept. The movement is continued until the flange 26 is put into the concave part 22 shown in FIG. 3 and the lower side of the extensible tube 72 is received by the receiving plate 21 while the outer surface of the extensible tube 72 tightly contacts with a part of the cutout 21a of the receiving plate 21.

For putting the front surface 26a of the flange 26 into the state where the front surface 26a is matched with the flange receiving surface 20b as described above, the compression of the extensible tube 72 may be slightly reduced. Alternatively, instead of this state, it is allowable to first set the extensible tube 72 at a height position enabling the front surface 26a of the flange 26 to face the flange receiving surface 20b, to release the compression of the extensible tube 72 in this state, and to make the front surface 26a of the flange 26 abut on the flange receiving surface 20b.

In the state where the lower side of the extensible tube 72 is received by the receiving plate 21, the pressing plate 28, next, is pushed to the extensible tube 72 from the upper side in the vertical direction, and the pressing plate 28 is attached to the flange receiving part 20 by the bolts 29. In this state, the arc-shaped pressing surface 28a of the pressing plate 28 contacts with the outer surface of the extensible tube 72, and presses the extensible tube 72 from the upper side. The "outer surface" is not the outer surface of the portion where the bellows is formed but the outer surface of the straight tube portion 72a that is formed, for example, at the end part of the extensible tube 72.

In this way, the extensible tube 72 constituting a part of the optical path tube 71 is connected with the laser apparatus 1 as the optical unit. As described above, the state after the connection is shown in FIG. 5 to FIG. 7. In this state, by the above-described biasing force of the extensible tube 72, the flange 26 of the extensible tube 72 is pressed hard onto the flange receiving part 20, that is, onto the laser apparatus 1. Similarly, by the biasing force of the extensible tube 72, the rigid tube 73 is pressed hard onto the optical unit 2.

Furthermore, in the embodiment, in the state where the extensible tube 72 is connected with the laser apparatus 1, by the biasing force of the plungers 23, the flange 26 is pushed hard onto the flange receiving surface 20b of the flange receiving part 20. That is, when the flange 26 is moved in the concave part 22 shown in FIG. 3 from the upper side to the lower side in the vertical direction as described above, the front end of each plungers 23 goes back against the force of the above-described spring. Then, when the flange 26 is stopped at a predetermined height position, each plunger 23 biases the flange 26 to the flange receiving surface 20b by the force of the above spring.

The above-described biasing force by the extensible tube 72 and the plungers 23 is a force that acts so as to extend the extensible tube 72 and to increase the total length of the optical path tube 71.

When the extensible tube 72 is moved in the vertical downward direction such that the flange 26 is accommodated in the concave part 22, the operation tab 27 fixed to the extensible tube 72 accordingly depresses an unillustrated movable tab of the limit switch 24. Thereby, the signal indicating that the optical path tube has been connected with the laser apparatus 1 is output from the limit switch 24. The signal is sent, for example, to a device that outputs a display or warning indicating the drop of the optical path tube 71, and the like, through the wire 24a.

As described above, the structure for connecting the extensible tube 72 with the laser apparatus 1 is similarly applied for connecting the rigid tube 73 of the optical path tube 71 with the optical unit 2. Hence, when the operation for connecting the extensible tube 72 with the laser apparatus 1 is performed as described above, in parallel with this operation, the operation for connecting the rigid tube 73 with the optical unit 2 is also performed. Thereby, between the laser apparatus 1 and the optical unit 2, the optical path tube 71 is connected with the laser apparatus 1 and the optical unit 2.

Furthermore, the structure for connecting the optical path tube 71 with the laser apparatus 1 and the optical unit 2 as described above is applied also for connecting the optical path tube 61 with the optical unit and the chamber reference member 3. Hence, by performing the same operation as the above operation, the optical path tube 61 is connected with the optical unit 2 and the chamber reference member 3.

6.3 Effect of Embodiment 1

In the structure of the connection between the optical unit and the optical path tube according to the embodiment, basically, the optical path tube 71 is pressed hard onto the laser apparatus 1 and the optical unit 2, by the biasing forces of both the extensible tube 72 and the plungers 23, so that the optical path tube 71 is connected with the laser apparatus 1 and the optical unit 2. Accordingly, in the connection structure, the connection can be performed by a simple operation, compared to the case where the flange is connected with the laser apparatus 1 and the optical unit 2 by bolting as shown in the comparative example of FIG. 30. Further, the sealing property between the flange 26 and the flange receiving part 20 can be increased by using the biasing forces of both the extensible tube 72 and the plungers 23.

In the case where the connection structure of the embodiment is applied for connecting the optical path tube 61 with the optical unit 2 and the chamber reference member 3 as described above, the following effects are particularly obtained. The chamber reference member 3 is sometimes moved, for example, as shown by the arrow A in FIG. 23 described above. For performing the movement, it is necessary to disconnect the optical path tube 61 from the chamber reference member 3. Thereafter, it is necessary to connect the optical path tube 61 with the chamber reference member 3 again, while the chamber reference member 3 is set at a predetermined position. In the case where the connection and disconnection between the optical path tube 61 and the chamber reference member 3 are repeated in this way, an easy connection between the optical path tube 61 and the chamber reference member 3 is particularly effective in simplifying the connection work.

Here, an example of a push force by both the extensible tube 72 that is a bellows tube and the plungers 23 will be calculated. The push force is a force to push the flange 26 to the flange receiving surface 20b. Conditions in this example are shown as follows. The extensible tube 72 is attached so as to contract by up to 5 mm. The attachment accuracy of an unillustrated frame to hold the optical path tube 71, and the like is ±1 mm. It is assumed that there is an error of ±1 mm for each of both ends of the optical path tube 71. The extensible tube 72 is designed so as to contract by at least 3 mm. Since the extensible tube 72 is basically designed so as to contract, there is no clearance between the optical path tube 71 and the flange receiving surface 20b. However, in the case where the optical path tube 71 is obliquely attached, the clearance may be produced. Hence, the flange 26 is pushed by the two plungers 23, so that the clearance is filled. Further, the following is satisfied.

Bellows spring constant: 5.9 N/mm
Bellows spring force: 30 N
Spring force of plunger: 25 N Under the above conditions, the total push force by the extensible tube 72 and the plungers 23 is 130 N. Meanwhile, the frictional force when the optical path tube 71 is pulled out of the concave part 22 is 26 N if the friction coefficient $\mu$ is 0.1.

In the embodiment, the receiving plate 21 and the pressing plate 28 act as a position determining part that determines the position of the optical path tube 71 connected with the laser apparatus 1.

More specifically, the receiving plate 21 having the cutout 21a that contacts with the outer surface of the extensible tube 72 constituting a part of the optical path tube 71 on the lower side in the vertical direction and on the side in a direction crossing the vertical direction acts as the first position determining part and the second position determining part in the present disclosure. Thereby, the extensible tube 72, that is, the optical path tube 71 is prevented from being carelessly moved in the vertical downward direction or in a direction crossing the vertical direction.

Furthermore, the pressing plate 28 having the pressing surface 28a that contacts with the outer surface of the extensible tube 72 constituting a part of the optical path tube 71 on the upper side in the vertical direction acts as the third position determining part in the present disclosure. Thereby, the optical path tube including the extensible tube 72 is prevented from being carelessly moved in the vertical upward direction.

In the embodiment, as shown in FIG. 5, the pressing plate 28 includes the lower end part 28b that faces a rear surface 26b (see FIG. 3) of the flange 26 received by the flange receiving part 20. The rear surface 26b of the flange 26 means the surface on the side opposite to the front surface 26a that is an open end of the flange 26. Since the pressing plate 28 includes the lower end part 28b described above, when the extensible tube 72 is deformed such that the flange 26 departs from the flange receiving part 20 and the optical path tube 71 is almost detached from the laser apparatus 1, the detachment can be prevented by the pressing plate 28.

In the embodiment, the portion near the cutout 21a of the receiving plate 21 faces the rear surface 26b of the flange 26 received by the flange receiving part 20. Hence, the effect to prevent the detachment of the optical path tube 71 from the laser apparatus 1 as described above is obtained also by the receiving plate 21.

In the embodiment, when the extensible tube 72 is moved in the vertical downward direction such that the flange 26 is accommodated in the concave part 22, the operation tab 27 fixed to the extensible tube 72 accordingly depresses the unillustrated movable tab of the limit switch 24. Since the limit switch 24 and the operation tab 27 are disposed in this way, when the optical path tube 71 is slightly moved from the normal position, the movable tab surely returns to the original position, and the disconnection between the optical path tube 71 and the laser apparatus 1 is surely detected. On the other hand, in the comparative example shown in FIG. 30, even when the optical path tube 71 is slightly moved from the normal position, the flange 64 sometimes continues to push the push button 111. In that case, although the optical path tube 71 is not set at the normal position, the limit switch 24 cannot detect the fact.

Further, in the case where the limit switch 24 is used instead of the push button switch 110 shown in the comparative example, there is a high possibility of satisfying safety standards in many countries and the like. Furthermore, by integrally operating a plurality of optical path tubes, for example, the optical path tube and the optical path tube 171, it is possible to reduce the number of necessary limit switches 24.

In the embodiment, since the blacking process has been processed to the inner surfaces of the extensible tube 72 and the rigid tube 73, it is possible to prevent the laser light L reflected by these inner surfaces from returning to the laser apparatus 1, and prevent the laser apparatus 1 from performing self oscillation.

Further, by supplying an XCDA (Extreme Clean Dry Air) from the gas inlet port 11 provided on the rigid tube 73 into the optical path tube 71, it is possible to prevent the laser light L from being muddied by the humidity in the optical path tube 71, or the like.

7. Embodiment 2

7.1 Configuration of Embodiment 2

Next, a structure of the connection between the optical unit and the optical path tube according to Embodiment 2 will be described. FIGS. 10 and 11 are a perspective view and an elevation view showing the structure of the connection between the optical unit and the optical path tube in the embodiment, respectively. FIG. 12 is an elevation view showing a state before the connection structure is assembled as shown in FIG. 11.

Basically, the connection structure in Embodiment 2 is different from the connection structure in Embodiment 1, in that a receiving plate 221 having a cutout 221a that is different in shape from the above-described cutout 21a is applied. That is, the receiving plate 221 in the embodiment has the cutout 221a that contacts with the outer surface of the extensible tube 72 constituting a part of the optical path tube 71 on the lower side in the vertical direction and on a side in a direction crossing the vertical direction. The cutout 221a has a shape in which a portion near an upper end part extends in an oblique direction crossing the vertical direction. Further, the receiving plate 221 has a cutout 221b that contacts with the outer surface of the extensible tube 172 constituting a part of the optical path tube 171, which is another optical path tube, on the lower side in the vertical direction and on a side in a direction crossing the vertical direction. The cutout 221b also has a shape in which a portion near an upper end part extends in an oblique direction crossing the vertical direction. The portion near the upper end part of the cutout 221a and the portion near the upper end part of the cutout 221b are inclined to the outside in the left direction and the outside in the right direction, respectively.

7.2 Operation of Embodiment 2

In the above configuration, when the extensible tube and the extensible tube 172 are connected with the laser apparatus 1 (see FIG. 1) while the flange receiving part 20 is interposed, or when the connection is released, the extensible tube 72 and the extensible tube 172 are moved in directions of arrows C in FIG. 12, respectively. That is, when the extensible tube 72 and the extensible tube 172 are connected with the laser apparatus 1, each flange 26 goes into the concave part 22 (see FIG. 3) as the flange accommodating part, from the upper side in the oblique direction crossing the vertical direction. The other operations are basically the same as those in Embodiment 1.

7.3 Effect of Embodiment 2

In the embodiment, the pressing plate 28 provided in Embodiment 1 is not provided. However, the cutouts 221a, 221b of the receiving plate 221, which extend obliquely, have portions that respectively contact with the outer surfaces of the extensible tubes 72, 172 on the upper side in the vertical direction, and therefore, it is possible to prevent the extensible tubes 72, 172 from being moved upward in some degree.

8. Embodiment 3

8.1 Configuration of Embodiment 3

Next, a structure of the connection between the optical unit and the optical path tube according to Embodiment 3 will be described. FIGS. 13 and 14 are a perspective view and an elevation view showing the structure of the connection between the optical unit and the optical path tube in the embodiment, respectively. FIG. 15 is an elevation view showing a state before the connection structure is assembled as shown in FIG. 14.

Basically, the connection structure in Embodiment 3 is different from the connection structure in Embodiment 1, in that a receiving plate 321 having a cutout 321a that is different in shape from the cutout 21a is applied. That is, the receiving plate 321 in the embodiment has a cutout 321a that contacts with the outer surface of the extensible tube 72 constituting a part of the optical path tube 71 on the lower side in the vertical direction and on a side in a direction crossing the vertical direction. However, the cutout 321a has a shape in which a portion near an upper end part extends in an oblique direction crossing the vertical direction. Further, the receiving plate 321 has a cutout 321b that contacts with the outer surface of the extensible tube 172 constituting a part of the optical path tube 171, which is another optical path tube, on the lower side in the vertical direction and on a side in a direction crossing the vertical direction. The cutout 321b also has a shape in which a portion near an upper end part extends in an oblique direction crossing the vertical direction. The portion near the upper end part of the cutout 321a and the portion near the upper end part of the cutout 321b are inclined to the same side in the right-left direction.

8.2 Operation of Embodiment 3

In the above configuration, when the extensible tube and the extensible tube 172 are connected with the laser apparatus 1 (see FIG. 1) while the flange receiving part 20 is interposed, or when the connection is released, the extensible tube 72 and the extensible tube 172 are moved in directions of arrows D in FIG. 15, respectively. That is, when the extensible tube 72 and the extensible tube 172 are connected with the laser apparatus 1, each flange 26 goes into the concave part 22 (see FIG. 3) as the flange accommodating part, from the upper side in the oblique direction crossing the vertical direction. The other operations are basically the same as those in Embodiment 1 or Embodiment 2.

8.3 Effect of Embodiment 3

In the embodiment also, the pressing plate 28 provided in Embodiment 1 is not provided. However, the cutouts 321a, 321b of the receiving plate 321, which extend obliquely, have portions that respectively contact with the outer surfaces of the extensible tubes 72, 172 on the upper side in the vertical direction, and therefore, it is possible to prevent the extensible tubes 72, 172 from being moved upward in some degree.

9. Modification 1 of Extensible Tube 9.1 Configuration of Modification 1 of Extensible Tube FIG. 16 is a cross sectional side view showing Modification 1 of the extensible tube that can be applied to the present disclosure. An extensible tube 472 in Modification 1 is a tube having a nested structure including an inner tube 400 and an outer tube 401 that are movable relative to each other in the tube axis direction, that is, in the right-left direction in FIG. 16. The outer surface of the inner tube 400 can be slid in the tube axis direction while the outer surface of the inner tube 400 tightly interlocks with the inner surface of the outer tube 401. Also in the extensible tube 472 having such a configuration, it is preferable to perform the above-described blacking process to the inner surface. The same goes for extensible tubes in Modifications 2 to 6 described later.

9.2 Operation of Modification 1 of Extensible Tube

When an optical path tube including the extensible tube 472 having the above configuration is disposed, for example, between the laser apparatus 1 and optical unit 2 shown in FIG. 1, and is connected with them, the inner tube 400 is moved to the outer tube 401, and thereby, the total length of the extensible tube 472 can be set to an appropriate length. Thereby, the flange 26 formed at one end of the inner tube 400 can be accommodated, for example, in the concave part 22 shown in FIG. 3.

9.3 Effect of Modification 1 of Extensible Tube

In Modification 1, the extensible tube 472 cannot generate biasing force. Hence, another biasing part such as, for example, the plunger 23 shown in FIG. 3 is used for pressing the flange 26 of the extensible tube 472 onto the flange receiving surface 20b shown in FIG. 3.

10. Modification 2 of Extensible Tube 10.1 Configuration of Modification 2 of Extensible Tube FIG. 17 is a cross sectional side view showing Modification 2 of the extensible tube that can be applied to the present disclosure. An extensible tube 572 in Modification 2 is a tube having a nested structure including an inner tube 500 and an outer tube 501 that are movable relative to each other in the tube axis direction, that is, in the right-left direction in FIG. 17. Basically, the extensible tube 572 is different from the extensible tube 472 in Modification 1 shown in FIG. 16, in that a spring 502 described below is included. That is, the outer surface of the inner tube 500 can be slid in the tube axis direction while the outer surface of the inner tube 500 tightly interlocks with the inner surface of the outer tube 501. Further, an annular convex part 501a is provided on a part of the outer surface of the outer tube 501, and the spring 502 is disposed between the flange 26 provided on the inner tube 500 and the annular convex part 501a. As the spring 502, for example, a coil spring is applied in a state of a compressed spring.

10.2 Effect of Modification 2 of Extensible Tube

In Modification 2, the biasing force for pressing the flange 26 onto the flange receiving surface 20b shown in FIG. 3 is obtained by the spring 502. Hence, even when another biasing part such as, for example, the plunger 23 shown in FIG. 3 is not used, the flange 26 can be pressed onto the flange receiving surface 20b. In addition to the spring 502, another biasing part such as the plunger 23 may be used.

11. Modification 3 of Extensible Tube 11.1 Configuration of Modification 3 of Extensible Tube FIG. 18 is a cross sectional side view showing Modification 3 of the extensible tube that can be applied to the present disclosure. An extensible tube 672 in Modification 3 is a tube having a nested structure including an inner tube 600 and an outer tube 601 that are movable relative to each other in the tube axis direction, that is, in the right-left direction in FIG. 18. Basically, the extensible tube 672 is different from the extensible tube 472 in Modification 1 shown in FIG. 16, in that a labyrinth structure 603 described below is included. That is, an inner end 600a of the inner tube 600 is formed as a flange that is slightly away from the inner surface of the outer tube 601. The labyrinth structure 603 is attached to a front end part of the outer tube 601. The labyrinth structure 603 can be slid in the tube axis direction while the labyrinth structure 603 tightly interlocks with the outer surface of the inner tube 600.

11.2 Effect of Modification 3 of Extensible Tube

In Modification 3, the extensible tube 672 cannot generate biasing force. Hence, another biasing part such as, for example, the plunger 23 shown in FIG. 3 is used for pressing the flange 26 of the extensible tube 672 onto the flange receiving surface 20b shown in FIG. 3. Further, in Modification 3, by the labyrinth structure 603, the laser light L is prevented from leaking from the interior of the extensible tube 672 to the exterior.

12. Modification 4 of Extensible Tube 12.1 Configuration of Modification 4 of Extensible Tube FIG. 19 is a cross sectional side view showing Modification 4 of the extensible tube that can be applied to the present disclosure. Basically, the extensible tube 772 in Modification 4 is different from the extensible tube 672 in Modification 3 shown in FIG. 18, in that the spring 502 described below is included. That is, the spring 502 is disposed between the flange 26 of the inner tube 600 and the labyrinth structure 603 of the outer tube 601. As the spring 502, for example, a coil spring is applied in a state of a compressed spring.

12.2 Effect of Modification 4 of Extensible Tube

In Modification 4, the biasing force for pressing the flange 26 onto the flange receiving surface 20b shown in FIG. 3 is obtained by the spring 502. Hence, even when another biasing part such as, for example, the plunger 23 shown in FIG. 3 is not used, the flange 26 can be pressed onto the flange receiving surface 20b. In addition to the spring 502, another biasing part such as the plunger 23 may be used. Further, in Modification 4, by the labyrinth structure 603, the laser light L is prevented from leaking from the interior of the extensible tube 772 to the exterior.

13. Modification 5 of Extensible Tube 13.1 Configuration of Modification 5 of Extensible Tube FIG. 20 is a cross sectional side view showing Modification 5 of the extensible tube that can be applied to the present disclosure. Basically, an extensible tube 872 in Modification 5 is different from the extensible tube 672 in Modification 3 shown in FIG. 18, in that the positional relation in the tube axis direction between the inner tube and the outer tube is reversed. That is, the end part of the extensible tube 872 on the side of the connection with the optical unit is provided with an outer tube 801, and the flange 26 is formed on the outer tube 801. Further, an outer end 800a of the inner tube 800 is formed as a flange that is slightly away from the inner surface of the outer tube 801. Moreover, the labyrinth structure 603 is attached to a rear end part of the outer tube 801.

13.2 Effect of Modification 5 of Extensible Tube

The effect of the extensible tube 872 is basically the same as the effect of the extensible tube 672 in Modification 3.

14. Modification 6 of Extensible Tube 14.1 Configuration of Modification 6 of Extensible Tube FIG. 21 is a cross sectional side view showing Modification 6 of the extensible tube that can be applied to the present disclosure. Basically, an extensible tube 972 in Modification 6 is different from the extensible tube 872 in Modification 5 shown in FIG. 20, in that the spring 502 described below is included. That is, an annular convex part 800b is attached to a part of the outer surface of the inner tube 800, and the spring 502 is disposed between the flange 26 provided on the outer tube 801 and the annular convex part 800b. As the spring 502, for example, a coil spring is applied in a state of a compressed spring. Basically, the extensible tube 972 in Modification 6 is different from the extensible tube 772 in Modification 4 shown in FIG. 19, in that the positional relation in the tube axis direction between the inner tube and the outer tube is reversed.

14.2 Effect of Modification 6 of Extensible Tube

The effect of the extensible tube 972 is basically the same as the effect of the extensible tube 772 in Modification 4.

15. Example of Optical Path Tube 15.1 Configuration of Example of Optical Path Tube Next, a specific example of the optical path tube in the present disclosure will be described. Here, as the optical path tube, the optical path tube 71 shown in FIGS. 1 and 2 will be described as an example.

It is preferable that the total length of the stainless-steel rigid tube 73 of the optical path tube 71 be 1200 mm or less. It is preferable that the above-described welded bellows tube or shaped bellows tube be applied as the extensible tube 72. The welded bellows tube has an advantage in that the range of the attachment angle is wide. The shaped bellows tube has an advantage in that the surface treatment is easily performed. It is preferable that the fixation of the extensible tube 72 and the rigid tube 73 be performed by bolting or welding. The fixation (spigot joint structure) by bolting is superior in that alignment of the optical path tube 71 can be performed.

In the case where the rigid tube 73 is made of aluminum, the total length of the rigid tube 73 is, for example, 373.5 mm, 388.5 mm, 747 mm, 1142.5 mm, or the like. In the case where the extensible tube 72 is made of stainless steel, the total length of the extensible tube 72 is, for example, 143 mm, 313 mm, or the like.

It is preferable to perform the connection between the extensible tube 72 and the rigid tube 73 by means by which they are not easily disconnected. For that purpose, it is preferable to use the above-described special bolt requiring a special tool for attachment and detachment. In addition, it is preferable to cover the tightening spot for the bolt with a cover.

In the case of using a spring as a biasing part for biasing a part of the optical path tube 71, a leaf spring or the like can be applied as the spring, other than the above-described coil spring. As the plunger 23, a pin type plunger or a ball type plunger can be suitably used. In the case where the pushing of the flange 26 requires a relatively long stroke or a relatively great push force, it is preferable to apply the pin type plunger. It is preferable to arrange the plunger 23 at least at two positions for one flange 26, and it is preferable to arrange the plungers 23 symmetrically with respect to the flange 26. Even in the case where one flange is shared by two optical path tubes, it is preferable to arrange the plunger 23 at least at two positions as described above.

Next, a result of the calculation of a preferable example of the inner diameter of the optical path tube will be described. In the calculation of the inner diameter, the preferable diameter was a value resulting from increasing, by 10 mm or more, a light beam diameter evaluated from the calculation of the energy distribution of the light that went through the interior of the optical path tube. The beam radius was evaluated from the intensity of the going light, based on the relation shown in FIG. 22. The relation in FIG. 22 is a relation about the light beam in which the light intensity distribution in the radial direction of the light beam is a Gaussian distribution. The horizontal axis indicates the beam radius, and the vertical axis indicates the light intensity. More specifically, NORMALIZED RADIUS of the horizontal axis is a beam radius indicated as an aperture size when the beam diameter is determined by making the light beam pass through an aperture, and a beam radius normalized assuming that $1/e^2$ diameter (radius) is 1. RELATIVE INTENSITY of the left vertical axis is the relative light intensity assuming that the maximum light intensity is 1. ENCIRCLED POWER of the right vertical axis indicates the output of the light contained in the beam diameter, and the relative light output assuming that the light output when the total energy is contained in a certain aperture size is 1. The above $1/e^2$ diameter (radius) is a beam radius determined by the length from the beam center to a position where the light intensity is $1/e^2$ of the peak intensity. The above-described diameter of the light beam is twice the beam radius.

First, the case where the laser light is emitted from a laser apparatus with a relatively high power of about 30 kW as an example and is advanced in the optical path tube will be described. When the diameter of the light beam obtained from the beam radius evaluated based on FIG. 22 is 40 mm, it is preferable that the inner diameter of the optical path tube be 60 mm or more. As the extensible tube 72 and the rigid tube 73, commercially available standard products can be used. As the laser apparatus with a relatively high power, for example, there is a carbon dioxide gas laser apparatus. On the other hand, in the case where the laser light is emitted from a laser apparatus with a relatively low power of about 400 W as an example and is advanced in the optical path tube, it is preferable that the inner diameter of the optical path tube be 40 mm or more, when the diameter of the light beam obtained in the above way is 20 mm. As the extensible tube 72 and the rigid tube 73, similarly, commercially available standard products can be used. As the laser apparatus with a relatively low power, for example, there are a YAG laser apparatus and an Nd:YVO$_4$ laser apparatus that generate the above-described pre-pulsed laser light.

The above description is intended to be not limitations but just examples. Accordingly, it is obvious to those in the art that the embodiments in the present disclosure can be modified without departing from the accompanying claims.

The terms used in the whole of the present specification and the accompanying claims should be understood as "non-limitative" terms. For example, the term "including" or "included" should be understood as "not limited to the description about the including or included". The term "having" should be understood as "not limited to the description about the having". Further, it should be understood that a modifier "one" described in the present specification and the accompanying claims means "at least one" or "one or more".

What is claimed is:

1. A structure of connection between an optical unit and an optical path tube, the optical path tube being detachable from the optical unit, the structure comprising:
   an extensible tube constituting at least a part of the optical path tube, the extensible tube being extensible in a tube axis direction;
   a flange attached to one end of the optical path tube;
   a flange receiving part provided on the optical unit, the flange receiving part receiving a front surface of the flange, the front surface of the flange being an end surface on an open side; and
   a biasing part configured to bias at least a part of the optical path tube in a direction in which the extensible tube extends, wherein
   the optical unit includes a flange accommodating part that accommodates at least a part of the flange, and
   the flange accommodating part has a shape that allows the flange to go into the flange accommodating part from an upper side in a vertical direction or an oblique direction crossing the vertical direction.

2. The structure according to claim 1, wherein
   the optical path tube has one end part provided with the extensible tube, and
   the flange is attached to one end of the extensible tube.

3. The structure according to claim 1, wherein the extensible tube is a bellows tube.

4. The structure according to claim 1, wherein the extensible tube is a tube having a nested structure, the nested structure including an inner tube and an outer tube that are movable in the tube axis direction relative to each other.

5. The structure according to claim 1, wherein the optical path tube includes a rigid tube that is connected with the extensible tube.

6. The structure according to claim 1, wherein the biasing part generates force for the biasing, by spring force.

7. The structure according to claim 6, wherein the biasing part comprises the extensible tube.

8. The structure according to claim 6, wherein the biasing part is a plunger.

9. The structure according to claim 1, comprising a first position determining part that contacts with the optical path tube connected with the optical unit, on a lower side in a vertical direction, the first position determining part being a determining part that determines a position of the optical path tube.

10. The structure according to claim 1, comprising a second position determining part that contacts with the optical path tube connected with the optical unit, on one side in a direction crossing a vertical direction, the second position determining part being a determining part that determines a position of the optical path tube.

11. The structure according to claim 1, comprising a third position determining part that contacts with the optical path tube connected with the optical unit, on an upper side in a vertical direction, the third position determining part being a determining part that determines a position of the optical path tube.

12. The structure according to claim 11, comprising a portion that faces a rear surface of the flange received by the flange receiving part.

13. The structure according to claim 1, wherein a blacking process has been performed to an inner surface of the optical path tube.

14. The structure according to claim 1, wherein the optical path tube includes a gas inlet port through which gas is introduced into an interior of the optical path tube.

15. The structure according to claim 1, wherein the optical unit is a chamber of an extreme ultraviolet light generating apparatus that generates an extreme ultraviolet light, the chamber being movable.

16. A structure of connection between an optical unit and an optical path tube, the optical path tube being detachable from the optical unit, the structure comprising:
   an extensible tube constituting at least a part of the optical path tube, the extensible tube being extensible in a tube axis direction;
   a flange attached to one end of the optical path tube;
   a flange receiving part provided on the optical unit, the flange receiving part receiving a front surface of the flange, the front surface of the flange being an end surface on an open side; and
   a biasing part configured to bias at least a part of the optical path tube in a direction in which the extensible tube extends, wherein
   an operation tab for operating a limit switch is attached to the optical path tube, and
   the limit switch is attached to the optical unit, operation of the limit switch being performed by means of the operation tab in a state where the front surface of the flange is received by the flange receiving part.

17. The structure according to claim 16, wherein
   the optical path tube has one end part provided with the extensible tube, and
   the flange is attached to one end of the extensible tube.

18. The structure according to claim 16, wherein the extensible tube is a bellows tube.

19. The structure according to claim 16, wherein the extensible tube is a tube having a nested structure, the nested structure including an inner tube and an outer tube that are movable in the tube axis direction relative to each other.

20. A structure of connection between an optical unit and an optical path tube, the optical path tube being detachable from the optical unit, the structure comprising:
   an extensible tube constituting at least a part of the optical path tube, the extensible tube being extensible in a tube axis direction;
   a flange attached to one end of the optical path tube;
   a flange receiving part provided on the optical unit, the flange receiving part receiving a front surface of the flange, the front surface of the flange being an end surface on an open side; and
   a biasing part configured to bias at least a part of the optical path tube in a direction in which the extensible tube extends, wherein
   the optical unit includes a flange accommodating part that accommodates at least a part of the flange, an operation tab for operating a limit switch is attached to the optical path tube, the limit switch is attached to the optical unit, operation of the limit switch being performed by means of the operation tab in a state where the front surface of the flange is received by the flange receiving part, and the operation tab and the limit switch are disposed such that the operation is performed by movement of the optical path tube when the flange goes into the flange accommodating part.

* * * * *